United States Patent
Yamazaki et al.

(10) Patent No.: US 6,639,244 B1
(45) Date of Patent: Oct. 28, 2003

(54) SEMICONDUCTOR DEVICE AND METHOD OF FABRICATING THE SAME

(75) Inventors: Shunpei Yamazaki, Tokyo (JP); Jun Koyama, Kanagawa (JP); Hiroshi Shibata, Kanagawa (JP); Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/479,842

(22) Filed: Jan. 10, 2000

(30) Foreign Application Priority Data

Jan. 11, 1999 (JP) .......................................... 11-004761

(51) Int. Cl.$^7$ .......................................... H01L 29/786
(52) U.S. Cl. .......................................... 257/72; 257/70
(58) Field of Search ...................................... 257/72, 70

(56) References Cited

U.S. PATENT DOCUMENTS

| | | | |
|---|---|---|---|
| 5,343,066 A | 8/1994 | Okamoto et al. | |
| 5,365,079 A | 11/1994 | Kodaira et al. | |
| 5,608,251 A | 3/1997 | Konuma et al. | |
| 5,620,905 A | 4/1997 | Konuma et al. | |
| 5,643,826 A | 7/1997 | Ohtani et al. | |
| 5,671,027 A | * 9/1997 | Sasano et al. ................. | 349/46 |
| 5,923,962 A | 7/1999 | Ohtani et al. | |
| 6,066,860 A | 5/2000 | Katayama et al. | |
| 6,088,258 A | * 7/2000 | Aitken et al. ............... | 365/149 |
| 6,140,667 A | 10/2000 | Yamazaki et al. | |
| 6,147,667 A | 11/2000 | Yamazaki et al. | |
| 6,278,131 B1 | 8/2001 | Yamazaki et al. | |
| 2001/0029070 A1 | 10/2001 | Yamazaki et al. | |

FOREIGN PATENT DOCUMENTS

| | | |
|---|---|---|
| JP | 03-280018 | 12/1991 |
| JP | 04-219736 | 8/1992 |
| JP | 05-034718 | 2/1993 |
| JP | 7-130652 | 5/1995 |
| JP | 8-78329 | 3/1996 |
| JP | 9-312260 | 12/1997 |
| JP | 10-294280 | 11/1998 |
| JP | 11-191628 | 7/1999 |

OTHER PUBLICATIONS

Specification and Drawings for Application No. 09/487,432, filed Jan. 19, 2000, "Semiconductor Device and Process for Production Thereof", Shunpei Yamazaki.

Ohtani et al., "LP–B: Late–News Poster: A 60–in. HDTV Rear–Projector with Continuous–Grain–Silicon Technology", May 17–22, 1998, pp. 467–470, SID 98 Digest, International Symposium Digest of Technical Papers, vol. XXIX.

Shimokawa et al., "Characterization of High–Efficiency Cast–Si Solar Cell Wafers by MBIC Measurement", Japanese Journal of Applied Physics, vol. 27, No. 5, May, pp. 751–758, 1988.

Preliminary Amendment submitted in U.S. patent application No. 09/874,670 on Jul. 5, 2001.

* cited by examiner

*Primary Examiner*—Jerome Jackson
(74) *Attorney, Agent, or Firm*—Eric J. Robinson; Robinson Intellectual Property Law Office, P.C.

(57) ABSTRACT

A semiconductor device having high TFT characteristics is realized. In a pixel matrix circuit of an AM-LCD, a lower electrode of a storage capacitor is made to include an element in group 15 and a catalytic element used for crystallization, so that its resistance is reduced. Further, a dielectric of the storage capacitor is made thin, so that capacity can be secured without increasing an area for formation of the capacitance. Thus, it becomes possible to secure sufficient storage capacitor even in the AM-LCD having a size of 1 inch or less in diagonal without lowering an opening ratio.

30 Claims, 15 Drawing Sheets

Driver Circuit          Pixel Matrix Circuit

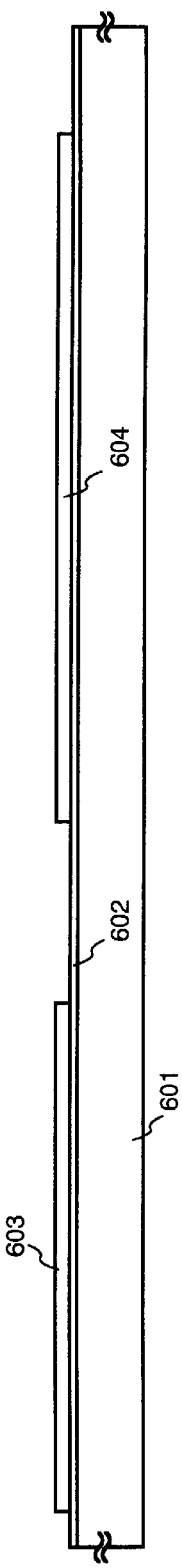
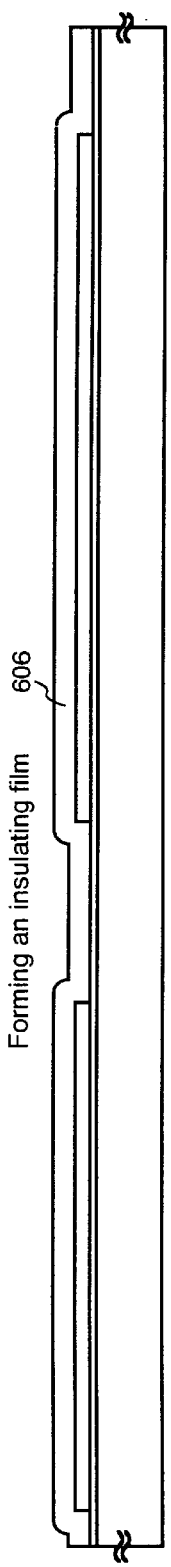
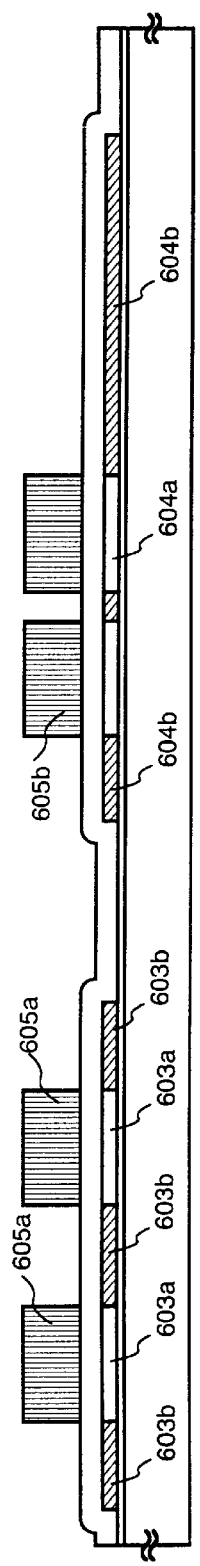
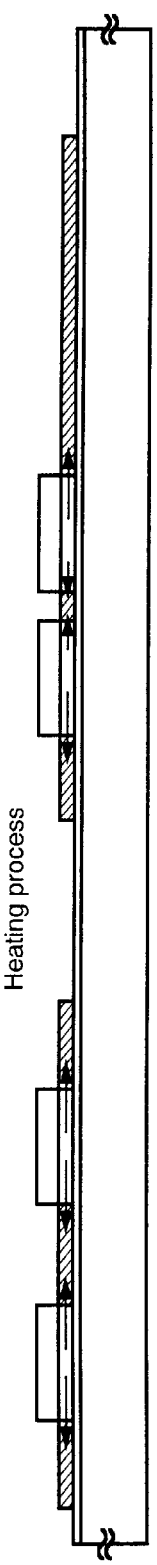

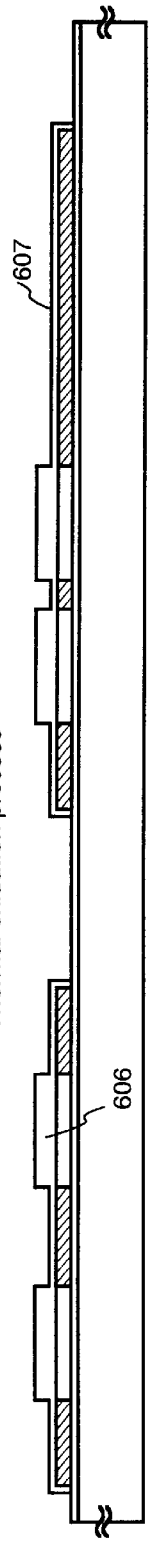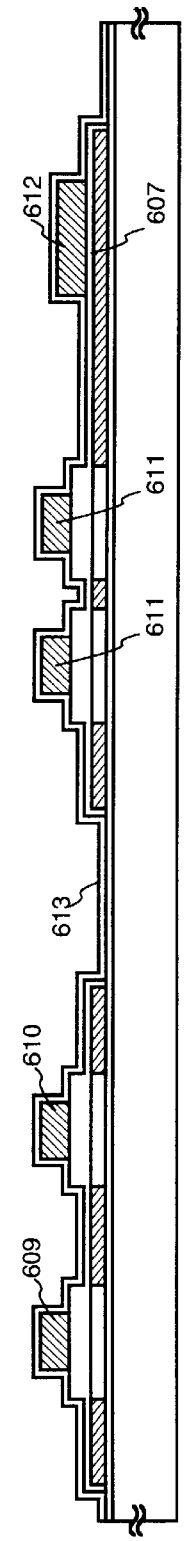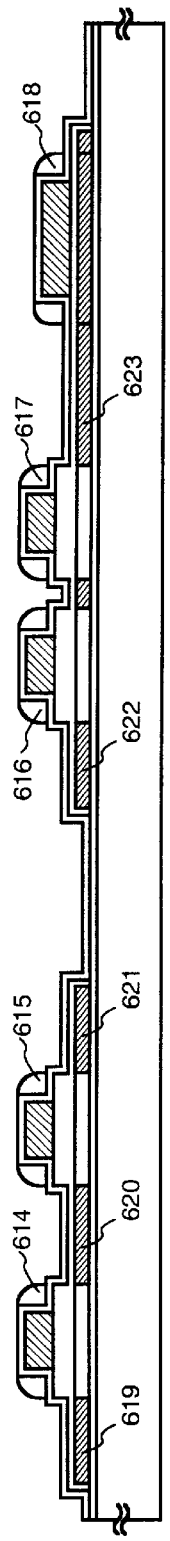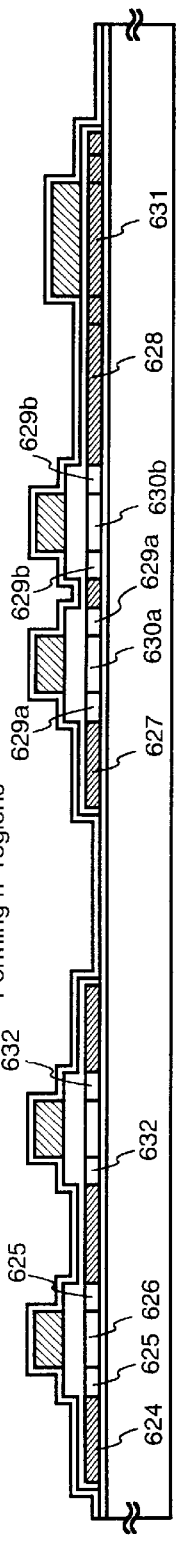
Fig. 7A Thermal oxidation process
Fig. 7B
Fig. 7C Forming n+ regions
Fig. 7D Forming n- regions

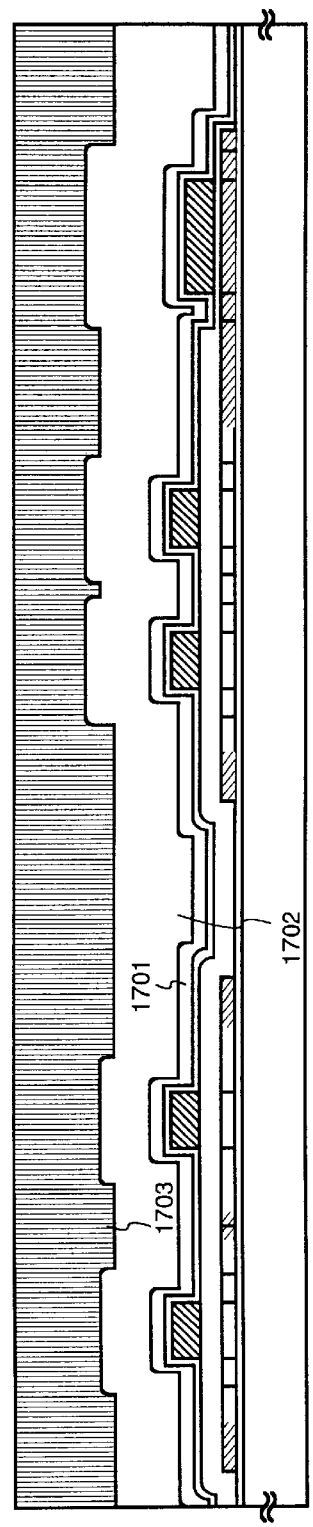
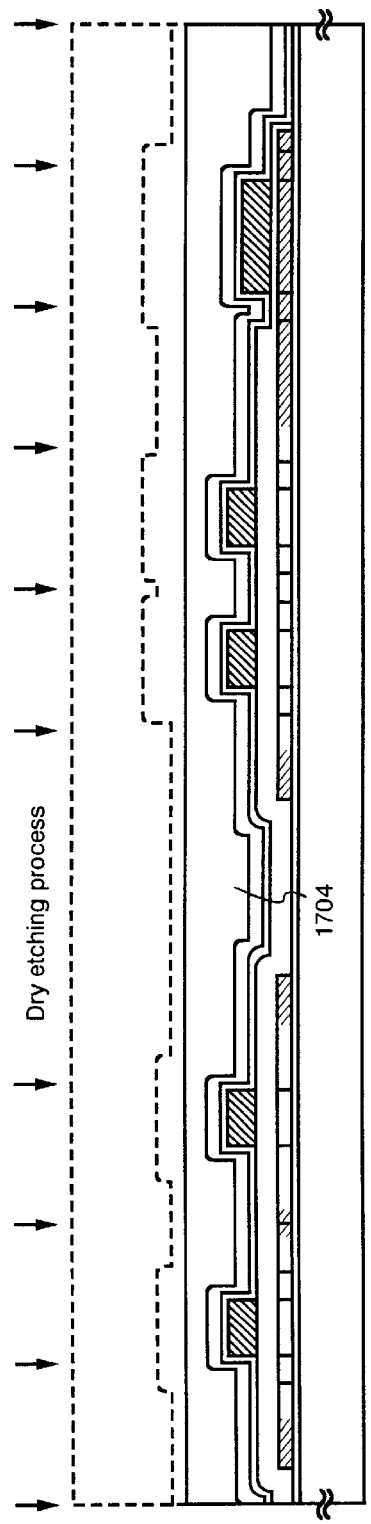
Fig. 10A
Fig. 10B

SEMICONDUCTOR DEVICE AND METHOD OF FABRICATING THE SAME

BACKGROUND OF THE INVENTION

1. Field of the Invention

The present invention relates to a semiconductor device including a circuit constituted by thin film transistors (hereinafter referred to as "TFTs"). Particularly, the present invention relates to a structure of an electro-optical device typified by a liquid crystal display device and an electronic equipment incorporating such an electro-optical device as a part.

Incidentally, in the present specification, the term "semiconductor device" indicates any devices functioning by using semiconductor characteristics, and all of electro-optical devices, semiconductor circuits, and electronic equipments are semiconductor devices.

2. Description of the Related Art

In recent years, an attention has been paid to a technique for constructing a thin film transistor TFT by using a semiconductor thin film (its thickness is several hundreds to several thousands nm) formed on a substrate having an insulating surface. The thin film transistor is widely used for an electronic device such as an IC or an electro-optical device, and particularly as a switching element of an image display device, its development has been hastened.

For example, in a liquid crystal display device, an attempt to apply the TFT to any electric circuits, such as a pixel matrix circuit for controlling each of pixel regions arranged in matrix form, a driver circuit for controlling the pixel matrix circuit, and a logic circuit (a processor circuit, a memory circuit, etc.) for processing a data signal from the outside, has been made.

Under the present circumstances, although a TFT using a noncrystalline silicon film (amorphous silicon film) as an active layer has been put to practical use, a TFT using a crystalline silicon film (a polysilicon film, a polycrystalline silicon film, etc.) is necessary for an electric circuit required to have further high speed operating performance, such as a driver circuit or a logic circuit.

For example, as a method of forming a crystalline silicon film on a glass substrate, techniques disclosed in Japanese Patent Unexamined Publication No. Hei. 7-130652 and No. Hei. 8-78329 by the present applicant are well known. The techniques disclosed in these publications use a catalytic element for promoting crystallization of an amorphous silicon film, so that formation of a crystalline silicon film superior in crystallinity is made possible by a heat treatment at 500 to 600° C. for about 4 hours.

Particularly, the technique disclosed in Japanese Patent Unexamined Publication No. Hei. 8-78329 is such that crystal growth almost parallel to a substrate surface is made by applying the above technique, and the present inventor et al. refer to a formed crystallized region especially as a side growth region (or a lateral growth region).

However, even if a driver circuit is constructed by using such TFTs, such a state has not been attained that required performance is completely satisfied. Under the present circumstances, it is impossible especially to construct with conventional TFTs a high speed logic circuit requiring an extremely high speed operation of megahertz to gigahertz.

As described above, for the purpose of realizing a system-on-panel having a built-in logic circuit, development of a quite novel material which has not existed has been required.

SUMMARY OF THE INVENTION

The present invention has been made to respond to such a request, and an object of the invention is to provide a structure of a TFT with extremely high performance, which can construct such a high speed logic circuit as has not been capable of being fabricated with a conventional TFT, and a method of fabricating the same.

Moreover, in the present invention, an improvement has been made on a pixel matrix circuit. Specifically, the invention provides a structure for forming a storage capacitor capable of securing large capacity with a small area, and a method of fabricating the same.

Another object of the invention is to provide an electro-optical device having high reliability by forming each circuit of the electro-optical device typified by an AM-LCD with a TFT having a suitable structure according to a function.

According to the construction of the invention disclosed in the specification, there is provided a semiconductor device, characterized by comprising:

a source region, a drain region, and a channel formation region formed between the source region and the drain region, the respective regions being formed on an insulating surface;

a gate insulating film formed to be in contact with at least the channel formation region; and a wiring formed to be in contact with the gate insulating film;

wherein a part of the source region and the drain region includes an element for promoting crystallization of silicon.

According to the construction, it is characterized in that the wiring includes at least one layer containing a kind of element selected from the group consisting of tantalum, molybdenum, tungsten, titanium, chromium, and silicon as its main ingredient.

According to the construction, it is characterized in that a part of the source region and the drain region includes an element or plural kinds of elements selected from the group consisting of nickel, cobalt, palladium, germanium, platinum, iron, and copper at a concentration of $1 \times 10^{19}$ atoms/cm$^3$ or more.

Further, according to the construction of the invention, there is provided a semiconductor device including a driver circuit and a pixel matrix circuit formed on a same substrate, characterized in that a thickness of a dielectric of a storage capacitor included in the pixel matrix circuit is smaller than a thickness of a gate insulating film of a pixel TFT included in the pixel matrix circuit.

According to the construction, it is characterized in that the dielectric of the storage capacitor included in the pixel matrix circuit is formed through at least a thermal oxidation step.

According to the construction, it is characterized in that one of electrodes of the storage capacitor is a semiconductor film, and the one electrode includes an element selected from the group consisting of nickel, cobalt, palladium, germanium, platinum, iron, and copper at a concentration of $1 \times 10^{19}$ atoms/cm$^3$ or more.

According to the construction, it is characterized in that the one electrode includes an element in group 15 at a concentration of $5 \times 10^{18}$ to $1 \times 10^{20}$ atoms/cm$^3$.

According to the construction, it is characterized in that the thickness of the gate insulating film of the pixel TFT is 50 to 200 nm, and the thickness of the dielectric of the storage capacitor is 5 to 50 nm.

According to the construction, it is characterized in that the pixel TFT includes an active layer, an insulating film being in contact with the active layer, and a wiring being in contact with the insulating film, the active layer includes a channel formation region, and a source region and a drain region formed at both sides of the channel formation region, and a part of the source region and the drain region includes an element selected from the group consisting of nickel, cobalt, palladium, germanium, platinum, iron, and copper at a concentration of $1 \times 10^{19}$ atoms/cm$^3$ or more.

According to the construction, it is characterized in that a low concentration impurity region is provided in at least one of a portion between the channel formation region and the source region, and a portion between the channel formation region and the drain region.

According to the construction of the invention to realize the structure, there is provided a method of fabricating a semiconductor device including a driver circuit and a pixel matrix circuit on a same substrate, characterized by comprising:

a first step of forming a semiconductor layer on the substrate by using a catalytic element;

a second step of selectively adding an element in group 15 to the semiconductor layer;

a third step of collecting the catalytic element by a heat treatment into a region where the element in group 15 is added;

a fourth step of forming an insulating film on the semiconductor layer;

a fifth step of removing a part of the insulating film to expose a part of the active layer;

a sixth step of forming a thermal oxidation film on the exposed part of the active layer;

a seventh step of forming a wiring on the insulating film and the thermal oxidation film;

an eighth step of forming a side wall at a side of the wiring;

a ninth step of adding an element in group 15 to the active layer while using the wiring and the side wall as masks;

a tenth step of removing the side wall;

an eleventh step of adding an element in group 15 to the active layer while using the wiring as a mask;

a twelfth step of adding an element in group 13 after a resist mask is formed on a region which becomes an NTFT; and a thirteenth step of carrying out a treatment for activating the elements in group 13 and group 15 added to the active layer.

Further, according to the construction of the invention, there is provided a method of fabricating a semiconductor device including a driver circuit and a pixel matrix circuit on a same substrate, characterized by comprising:

a first step of forming a semiconductor layer on the substrate by using a catalytic element;

a second step of forming an insulating film on the semiconductor layer;

a third step of selectively adding an element in group 15 using a mask to the semiconductor layer;

a fourth step of removing a part of the insulating film using the mask to expose a part of the active layer;

a fifth step of collecting the catalytic element by a heat treatment into a region where the element in group 15 is added;

a sixth step of forming a thermal oxidation film on the exposed part of the active layer;

a seventh step of forming a wiring on the insulating film and the thermal oxidation film;

an eighth step of forming a side wall at a side of the wiring;

a ninth step of adding an element in group 15 to the active layer while using the wiring and the side wall as masks;

a tenth step of removing the side wall;

an eleventh step of adding an element in group 15 to the active layer while using the wiring as a mask;

a twelfth step of adding an element in group 13 after a resist mask is formed on a region which becomes an NTFT; and a thirteenth step of carrying out a treatment for activating the elements in group 13 and group 15 added to the active layer.

According to the construction, it is characterized in that a part of the active layer includes at least a region which becomes a storage capacitor of the pixel matrix circuit.

BRIEF DESCRIPTION OF THE DRAWINGS

In the accompanying drawings in which:

FIGS. 6A to 6D are views showing fabricating steps of an AM-LCD;

FIGS. 7A to 7D are views showing fabricating steps of the AM-LCD;

FIGS. 10A and 10B are views showing fabricating steps of an AM-LCD;

DETAILED DESCRIPTION OF THE INVENTION

Figure 1:
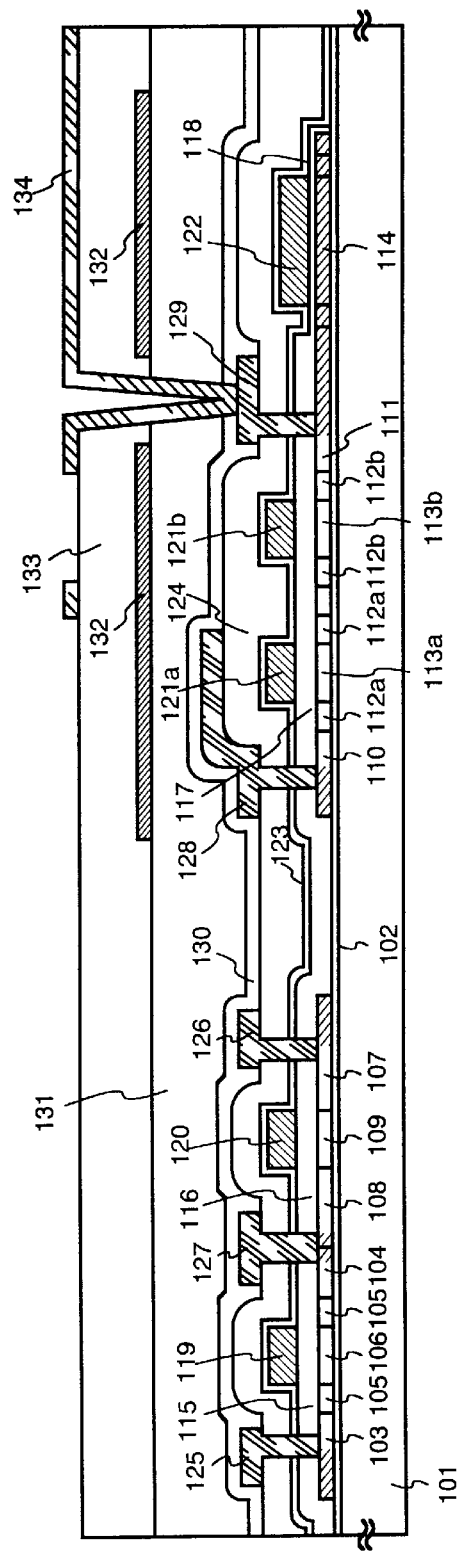
FIG. 1 is a view showing a sectional structure of an AM-LCD.

The embodiment mode of the present invention will be described with reference to FIG. 1. FIG. 1 is a sectional view of an AM-LCD in which a driver circuit and a pixel matrix circuit are integrally formed on the same substrate. Here, a CMOS circuit is shown as a basic circuit constituting the driver circuit, and a double gate structure TFT is shown as a pixel TFT. Of course, the invention is not limited to the double gate structure, but a triple gate structure or a single gate structure may be used.

In FIG. 1, reference numeral 101 designates a substrate having heat resistance, and a quartz substrate, a silicon substrate, a ceramic substrate, or a metal substrate (typically, a stainless substrate) may be used. In any case of using any substrate, a base film (preferably an insulating film containing silicon as its main ingredient) may be provided as the need arises.

Reference numeral 102 designates a silicon oxide film provided as a base film, and a semiconductor layer which becomes an active layer of a driver TFT, an active layer of a pixel TFT, and a lower electrode of a storage capacitor is formed thereon. Incidentally, in the present specification, an "electrode" is a part of a "wiring", and indicates a portion where electrical connection to another wiring is made or a portion where the wiring intersects with a semiconductor layer. Thus, for convenience of explanation, although "wiring" and "electrode" are differently used, the term "wiring" always includes "electrode".

In FIG. 1, the active layer of the driver TFT is formed of a source region 103, a drain region 104, a LDD (Lightly Doped Drain) region 105, and a channel formation region 106 of an N-channel type TFT (hereinafter referred to as an "NTFT"), and a source region 107, a drain region 108, and a channel formation region 109 of a P-channel type TFT (hereinafter referred to as a "PTFT").

The active layer of the pixel TFT (here, an NTFT is used) is formed of a source region 110, a drain region 111, LDD regions 112a and 112b, and channel formation regions 113a and 113b. Further, the semiconductor layer extended from the drain region 111 is used as a lower electrode 114 of the storage capacitor.

In FIG. 1, although the lower electrode 114 is directly connected to the drain region 111 of the pixel TFT, such a structure may be adopted that they are indirectly connected to each other so that the lower electrode 114 and the drain region III are electrically connected.

In this lower electrode 114, an element in group 15 of the periodic table is added to the semiconductor layer. Further, the present invention is characterized in that a catalytic element used for crystallization of the semiconductor film exists at a concentration of $1 \times 10^{19}$ atoms/cm$^3$ or more (typically $3 \times 10^{19}$ to $1 \times 10^{21}$ atoms/cm$^3$) in the lower electrode 114. That is, since it can be directly used as an electrode even if a voltage is not applied to an upper wiring 122 of the storage capacitor, the structure is effective in reduction of consumed electric power of the AM-LCD.

Similarly, one of the features of the present invention is that regions (regions indicated by oblique lines in FIG. 1) containing the catalytic element used for crystallization of the semiconductor film exist in part of the source region 110 and the drain region 111 of the pixel TFT, and the source regions 103 and 107 and the drain regions 104 and 108 of the driver TFT. In FIG. 1, a contact portion where a drain wiring 127 is in contact with the drain region 104 of the NTFT and the drain region 108 of the PTFT is the region containing the catalytic element. When such a structure is adopted, excellent ohmic contact can be obtained by the existence of the catalytic element, which is effective. It is presumed that the excellent contact is obtained since silicide is formed by the existence of the catalytic element.

A gate insulating film is formed to cover the active layer and the lower electrode of the storage capacitor. In the present invention, a dielectric 118 of the storage capacitor is formed to be thinner than a gate insulating film 117 of the pixel TFT. Typically, it is appropriate that the thickness of the dielectric 118 of the storage capacitor is made 5 to 50 nm (preferably 10 to 30 nm) and the thickness of the gate insulating film 117 is made 50 to 200 nm (preferably 100 to 150 nm).

Like this, the lower electrode 114 of the storage capacitor is made to contain the element in group 15 and the catalytic element used for crystallization so that the resistance of the lower electrode 114 is lowered, and further, the dielectric of the storage capacitor is made thin. Accordingly, the capacity can be secured without increasing an area for formation of the capacitance.

Here, although the gate insulating film 117 of the pixel TFT and gate insulating films 115 and 116 of the driver TFT are made to be the same insulating film having the same thickness, the present invention is not particularly limited. For example, such a structure may be adopted that at least two kinds of TFTs or more having different gate insulating films exist on the same substrate according to circuit characteristics.

Next, gate wirings 119 and 120 of the driver TFT and a gate wiring 121a and 121b of the pixel TFT are formed on the gate insulating films 115, 116, and 117. At the same time, an upper electrode 122 of the storage capacitor is formed on the dielectric 118 of the storage capacitor. As constituent material of the gate wirings 119 to 121b and the upper electrode 122 of the storage capacitor, a conductive film having heat resistance capable of withstanding a temperature of 800 to 1150° C. (preferably 900 to 1100° C.) is used.

Typically, a silicon film having conductivity (for example, phosphorus doped silicon film, boron doped silicon film, etc.), or a metal film (for example, tungsten film, tantalum film, molybdenum film, titanium film, etc.) may be used. Further, a silicide film to obtained by making silicide of the foregoing metal film, or a nitride film obtained by making nitride thereof (tantalum nitride film, tungsten nitride film, titanium nitride film, etc.) may be used. These films may be freely combined to form a laminate.

In the case where the metal film is used, in order to prevent oxidation of the metal film, it is desirable to make a laminate structure with the silicon film. In view of prevention of oxidation, such a structure as to cover the metal film with the silicon nitride film is effective. In FIG. 1, a silicon nitride film 123 is provided to prevent oxidation of the gate wirings.

Next, reference numeral 124 designates a first interlayer insulating film, and is formed of an insulating film (single layer or laminate layer) containing silicon. As the insulating film containing silicon, a silicon oxide film, a silicon nitride film, a silicon nitride oxide film (nitrogen content is higher than oxygen content), or a silicon nitride oxide film (oxygen content is higher than nitrogen content) may be used.

Contact holes are provided in the first interlayer insulating film 124, and source wirings 125 and 126 and the drain wiring 127 of the driver TFT, and a source wiring 128 and a drain wiring 129 of the pixel TFT are formed. A passivation film 130 and a second interlayer insulating film 131 are formed thereon, and further, a black mask (light-shielding film) 132 is formed thereon. Further, a third interlayer insulating film 133 is formed on the black mask 132, and after a contact hole is provided, a pixel electrode 134 is formed.

In FIG. 1, although the black mask (light-shielding film) 132 is formed on the second interlayer insulating film 131, the invention is not particularly limited, but the mask may be provided as the need arises. For example, such a structure may be adopted that a light-shielding film is provided on an opposite substrate, or such a structure may be adopted that a light-shielding film using the same material as the gate wiring is provided under the respective TFTs.

As the second interlayer insulating film 131 or the third interlayer insulating film 133, a resin film having low relative dielectric constant is preferable. As the resin film, a polyimide film, an acrylic film, a polyamide film, a BCB (benzocyclobutene) film, or the like may be used.

As the pixel electrode 134, a transparent conductive film typified by an ITO film may be used when a transmission type AM-LCD is fabricated, and a metal film having high reflectivity typified by an aluminum film may be used when a reflection type AM-LCD is fabricated.

In FIG. 1, although the pixel electrode 134 is electrically connected to the drain region 111 of the pixel TFT through the drain electrode 129, such a structure may be adopted that the pixel electrode 134 and the drain region 111 are directly connected to each other.

The AM-LCD having the structure as described above is characterized in that the lower electrode 114 of the storage capacitor is made to contain the element in group 15 and the catalytic element used for crystallization so that the resistance of the lower electrode 114 is reduced, and further, the dielectric of the storage capacitor is formed to be thinner than the gate insulating film of the pixel TFT. By doing so, the TFT with high performance and the storage capacitor capable of securing large capacity with a small area can be realized.

The present invention having the foregoing structure will be described in more detail with the following embodiments.

Embodiment 1

In this embodiment, fabricating steps for realizing the structure of FIG. 1 described in the embodiment mode of the present invention will be described with reference to FIGS. 2A to 4C.

First, a quartz substrate 201 is prepared as a substrate, and a silicon oxide film (also called a base film) 202 having a thickness of 20 nm and an amorphous silicon film (not shown) are continuously formed without opening to the air. By doing so, it is possible to prevent an impurity such as boron contained in the air from being adsorbed to the under surface of the amorphous silicon film.

In this embodiment, although the amorphous silicon film is used, other semiconductor films may be used. A microcrystal silicon film may be used, or an amorphous silicon germanium film may be used. As means for forming the base film and the semiconductor film, a PCVD method, an LPCVD method, a sputtering method, or the like may be used.

Next, crystallization of the amorphous silicon film is carried out. In this embodiment, as crystallizing means, a technique disclosed in Japanese Patent Unexamined Publication No. Hei. 9-312260 was used. The technique disclosed in the publication uses an element selected from nickel, cobalt, palladium, germanium, platinum, iron, and copper as a catalytic element for promoting crystallization of a silicon film.

Figure 2A:
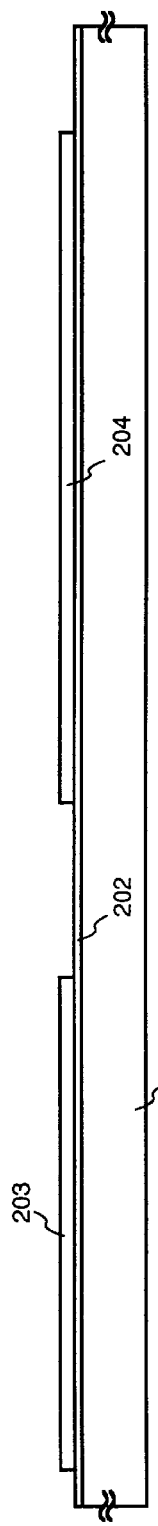
FIGS. 2A to 2E are views showing fabricating steps of an AM-LCD.

In this embodiment, nickel was selected as the catalytic element. A layer containing nickel was formed on the amorphous silicon film, and a heat treatment at 550° C. for 14 hours was carried out to make crystallization. Then, the formed crystalline silicon (polysilicon) film was patterned, so that a semiconductor layer 203 of a driver TFT, and a semiconductor layer 204 of a pixel TFT were formed (FIG. 2A).

An impurity element (phosphorus or boron) for controlling a threshold voltage of a TFT may be added to the crystalline silicon film before or after formation of the semiconductor layer of the driver TFT and the pixel TFT. This step may be carried out for only a NTFT or a PTFT, or for both.

Figure 2B:
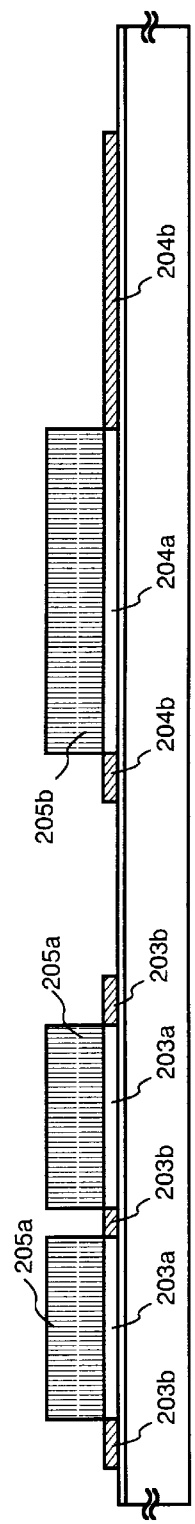

Next, as shown in FIG. 2B, resist masks 205a and 205b are formed on active layers 203a and 204a, and an adding step of an element (in this embodiment, phosphorus) in group 15 is carried out. It is preferable that the concentration of phosphorus to be added is $5 \times 10^{18}$ to $1 \times 10^{20}$ atoms/cm$^3$ (preferably $1 \times 10^{19}$ to $5 \times 10^{19}$ atoms/cm$^3$). However, since the concentration of phosphorus to be added is changed through temperature and time in a subsequent gettering step, and further, through an area of a phosphorus doped region, the concentration is not limited to this concentration range. In this way, regions where phosphorus was added (hereinafter referred to as "phosphorus doped regions") 203b and 204b were formed.

The resist mask 205a is disposed in such a manner that part (or all) of a region which subsequently becomes a source region or a drain region of the driver TFT is exposed. Similarly, the resist mask 205b is disposed in such a manner that part (or all) of a region which subsequently becomes a source region or a drain region of the pixel TFT is exposed. At this time, since a resist mask is not disposed on a region which becomes a lower electrode of a storage capacitor, phosphorus is added to the whole surface, so that the phosphorus doped region 204b is formed.

Incidentally, it is preferable that the surface of the active layer is oxidized before the resist masks 205a and 205b are formed. When a silicon oxide film is provided in advance, adhesion between the active layer and the resist mask is raised, and further, it is possible to prevent the active layer from being polluted by an organic material.

Next, the resist masks 205a and 205b are removed, and a heat treatment at 500 to 650° C. is applied for 2 to 16 hours, so that gettering of the catalytic element (in this embodiment, nickel) used for crystallization of the silicon film is carried out. In order to effect the gettering function, temperature of about ±50° C. from the maximum temperature of heat hysteresis is necessary. Since the heat treatment for crystallization is carried out at 550 to 600° C., the gettering function can be sufficiently obtained by a heat treatment of 500 to 650° C.

Figure 2C:
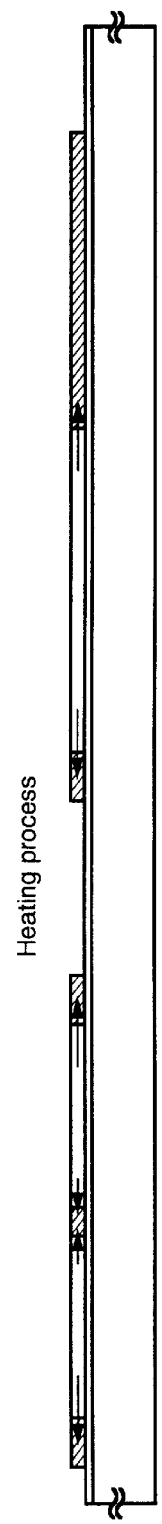

In this embodiment, a heat treatment at 600° C. for 8 hours was applied, so that nickel moved in the directions of arrows (shown in FIG. 2C) and was gettered and captured by phosphorus contained in the phosphorus doped regions 203b and 204b. In this way, gettering regions (regions corresponding to the phosphorus doped regions 203b and 204b) are formed. By this, the concentration of nickel contained in the regions 203a and 204a is reduced to $2 \times 10^{17}$ atoms/cm$^3$ or less (preferably $1 \times 10^{16}$ atoms/cm$^3$ or less). The gettering region remains as a lower electrode of the storage capacitor, and remains as a part or the whole of the source region or drain region of the driver TFT and the pixel TFT (FIG. 2C).

Figure 2D:
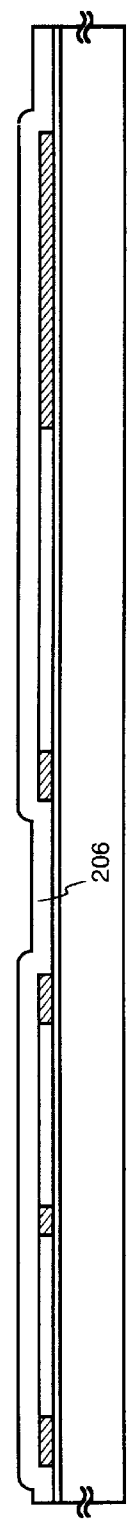

Next, a gate insulating film 206 is formed by a plasma CVD method or a sputtering method (FIG. 2D). This gate insulating film 206 is an insulating film which comes to function as a gate insulating film of the pixel TFT, and the film thickness is made 50 to 200 nm. In this embodiment, a silicon oxide film with a thickness of 100 nm was used.

Instead of only the silicon oxide film, a laminate structure in which a silicon nitride film is provided on the silicon oxide film may be adopted, or a silicon nitride oxide film in which nitrogen is added to the silicon oxide film may be used.

Figure 2E:
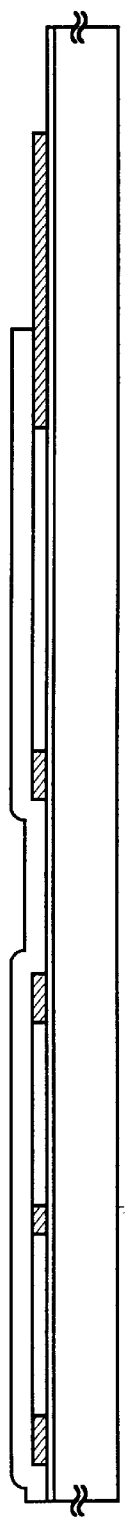

After the gate insulating film 206 is formed, a resist mask (not shown) is provided so that the gate insulating film is selectively removed. At this time, the gate insulating film 206 is made to remain on the pixel TFT, and the film on the region which becomes the driver TFT and the storage capacitor is removed. In this way, the state of FIG. 2E is obtained.

Next, a heat treatment step at 800 to 1150° C. (preferably 900 to 1100° C.) for 15 minutes to 8 hours (preferably 30 minutes to 2 hours) is carried out in an oxidizing atmosphere (thermal oxidation step). In this embodiment, a heat treatment at 950° C. for 30 minutes was carried out in an oxygen atmosphere. In this heat treatment, since such an effect can be obtained that defects etc. in crystal grains of the active layer are repaired, a crystalline silicon film having extremely excellent crystallinity is formed.

As the oxidizing atmosphere, both a dry oxygen atmosphere and a wet oxygen atmosphere may be used, or an atmosphere in which a halogen element is contained in an oxygen atmosphere may be used. In the case of employing the thermal oxidation step With the atmosphere containing the halogen element, this is effective since the effect of removing nickel is also expected.

Figure 3A:
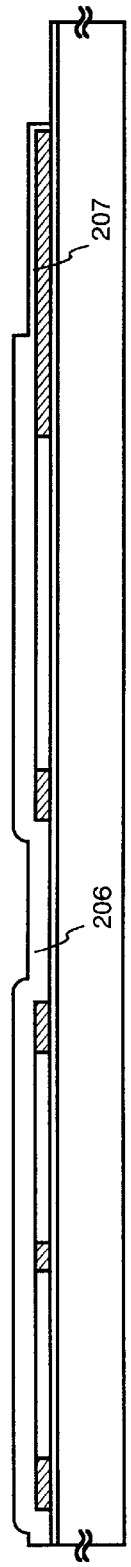
FIGS. 3A to 3D are views showing fabricating steps of the AM-LCD.

By carrying out the thermal oxidation step in this way, a silicon oxide film (thermal oxidation film) 207 having a thickness of 5 to 50 nm (preferably 10 to 30 nm) is formed on the surface of the semiconductor layer exposed at the region which becomes the storage capacitor (FIG. 3A). The silicon oxide film 207 finally functions as a dielectric of the storage capacitor, and the silicon oxide film 206 functions as the gate insulating film of the pixel TFT and the driver TFT.

Although not shown for simplification, an oxidation reaction proceeds also at the interface between the gate insulating film 206 made of the silicon oxide film remaining in the pixel TFT and the driver TFT and the semiconductor layers 203 and 204 thereunder. Thus, the thickness of the gate insulating film 206 of the pixel TFT becomes finally 50 to 200 nm (preferably 100 to 150 nm).

After the thermal oxidation step is completed in this way, gate wirings 209 (at the side of the NTFT) and 210 (at the side of the PTFT) of the driver TFT, gate wirings 211 of the pixel TFT, and an upper wiring (can also be said to be an upper electrode) 212 of the storage capacitor are formed. As the gate wirings 211, although two gate wirings are shown since the pixel TFT has a double gate structure, they are actually the same wiring.

In this embodiment, as the gate wirings 209 to 211 and the upper wiring 212 of the storage capacitor, a laminate film of silicon film/tungsten nitride film/tungsten film in order from the lower layer (or silicon film/tungsten silicide film in order from the lower layer) was used. Of course, it is needless to say that the other conductive films explained in the embodiment mode of the invention can also be used. In this embodiment, the thickness of the respective gate wirings was made 250 nm.

In this embodiment, the silicon film of the lowest layer is formed by using a low pressure thermal CVD method. Since the insulating film of the region which becomes the storage capacitor is as thin as 5 to 50 nm, in case that a sputtering method or a plasma CVD method is used, there is a fear that damage is caused to the semiconductor layer (active layer).

Thus, it is preferable to use the thermal CVD method in which a film can be formed by a chemical vapor reaction. Incidentally, it is preferable that an impurity to give conductivity is added into the silicon film of the lowest layer.

Next, a silicon nitride film 213 having a thickness of 25 nm is formed to cover the gate wirings 209 to 211 and the upper wiring 212 of the storage capacitor. This silicon nitride film 213 prevents oxidation of the gate wirings 209 to 211 and the upper wiring 212 of the storage capacitor, and at the same time, functions as an etching stopper when a side wall made of a silicon film is removed later.

At this time, it is effective to carry out a plasma treatment using a gas containing hydrogen (in this embodiment, ammonia gas) as a pretreatment to the formation of the silicon nitride film 213. Since hydrogen activated (excited) by plasma in this pretreatment is confined in the active layer (semiconductor layer), hydrogen termination is effectively carried out.

Further, when a nitrous oxide gas is added to the gas containing hydrogen, the surface of the object to be treated is cleaned by generated moisture, and especially pollution due to boron etc. contained in the air can be effectively prevented.

Figure 3B:
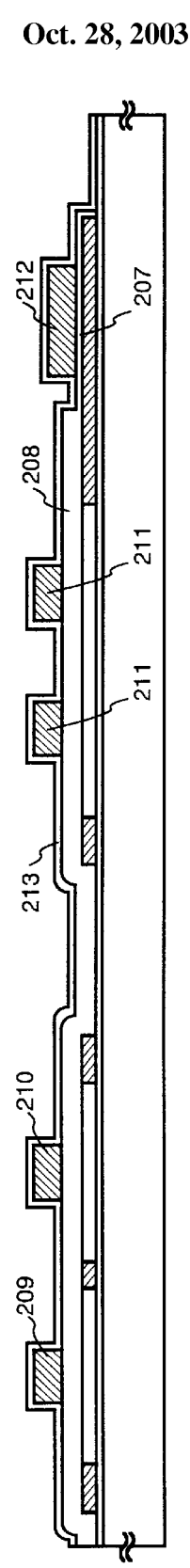
Figure 3C:
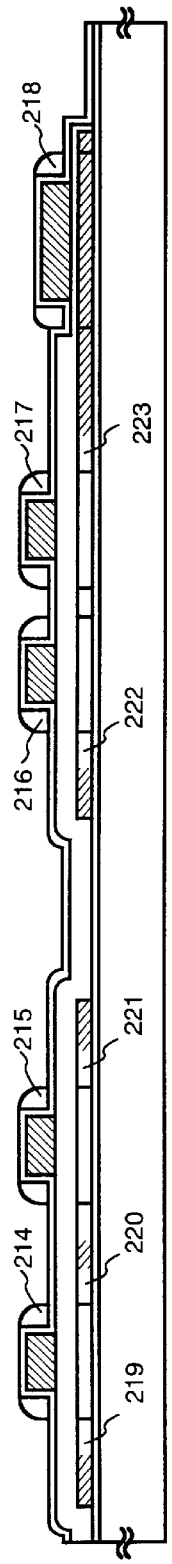

In this way, the state of FIG. 3B is obtained. Next, an amorphous silicon film (not shown) is formed, and anisotropic etching by a chlorine based gas is carried out, so that side walls 214 to 218 are formed. After the side walls 214 to 218 are formed, an adding step of an element in group 15 (in this embodiment, phosphorus) is carried out to the semiconductor layers 203 and 204. At this time, the gate wirings 209 to 211, the upper electrode 212 of the storage capacitor, and the side walls 214 to 218 become masks, so that impurity regions 219 to 223 are formed in a self-aligning manner (FIG. 3C). The concentration of phosphorus added to the impurity regions 219 to 223 are adjusted to become $5 \times 10^{19}$ to $1 \times 10^{21}$ atoms/cm$^3$.

As the adding step of phosphorus, an ion implantation method in which mass separation is carried out may be used, or a plasma doping method in which mass separation is not carried out may be used. With respect to conditions such as acceleration voltage and dose amount, an operator may determine optimum values.

In this embodiment, although addition of the impurity is carried out by using the side walls, the invention is not particularly limited, but a resist mask using a photomask may be used instead of the side walls.

Figure 3D:
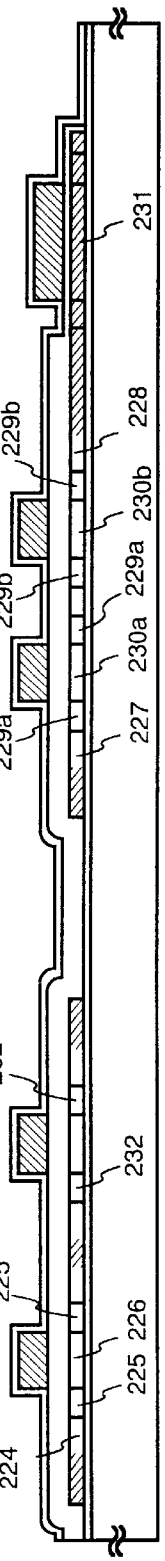

After the state of FIG. 3C is obtained, the side walls 214 to 218 are removed, and an adding step of phosphorus is again carried out. In this step, the addition is carried out at a dose amount lower than the prior adding step of phosphorus. In this way, low concentration impurity regions are formed in the regions where phosphorus was not added through the masks of the side walls 214 to 218 in the previous step. The concentration of phosphorus added to the low concentration impurity regions is adjusted to become $5 \times 10^{17}$ to $5 \times 10^{18}$ atoms/cm$^3$ (FIG. 3D).

Similarly to the step shown in FIG. 3C, as the adding step of phosphorus, an ion implantation method in which mass separation is carried out may be used, or a plasma doping method in which mass separation is not carried out may be used. With respect to conditions such as acceleration voltage and dose amount, an operator may determine optimum values.

By this step, a source region 224, an LDD region 225, and a channel formation region 226 of the NTFT forming the CMOS circuit are defined. Besides, a source region 227, a drain region 228, LDD regions 229a and 229b, and channel formation regions 230a and 230b of the pixel TFT are defined. Further, a lower electrode 231 of the storage capacitor is defined.

Similarly to the NTFT, a low concentration impurity region 232 is formed also in a region which becomes the PTFT of the CMOS circuit.

Figure 4A:
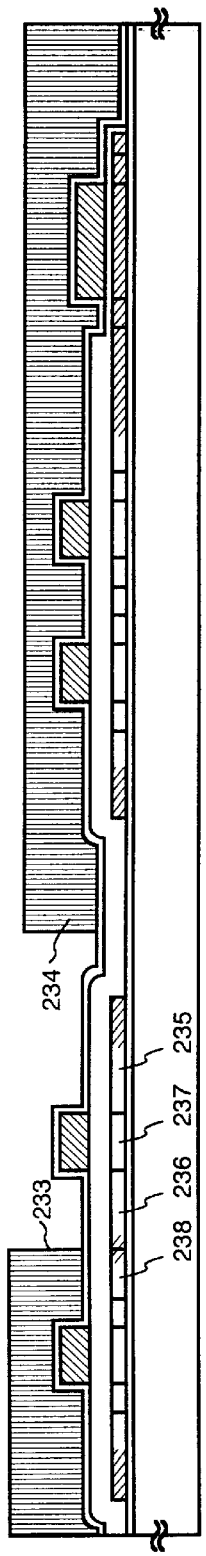
FIGS. 4A to 4C are views showing fabricating steps of the AM-LCD.

Next, portions except the region which becomes the PTFT of the CMOS circuit are covered with resist masks 233 and 234, and an adding step of an element in group 13 (in this embodiment, boron) is carried out. In this step, the addition is made at such a dose amount as to form an impurity region having a concentration higher than that of the already added phosphorus. Specifically, adjustment is made so that boron is added at a concentration of $1\times10^{20}$ to $3\times10^{21}$ atoms/cm$^3$. As a result, the conductivity of all impurity regions formed in the region which becomes the PTFT and exhibiting N-type conductivity is inverted by boron, and the regions become impurity regions exhibiting P-type conductivity (FIG. 4A).

Of course, as the adding step of boron, an ion implantation method in which mass separation is carried out may be used, or a plasma doping method in which mass separation is not carried out may be used. With respect to conditions such as acceleration voltage and dose amount, an operator may determine optimum values.

By this step, a source region 235, a drain region 236, and a channel formation region 237 of the PTFT constituting the CMOS circuit are defined. Besides, a drain region 238 of the NTFT of the CMOS circuit is defined.

Of course, the order of doping is not limited to this embodiment, but for example, after the step shown in FIG. 3B, the step of forming the low concentration impurity regions by addition of phosphorus may be carried out prior to the step of forming the side walls 214 to 218. Besides, the adding step of phosphorus may be carried out separately in the region which becomes the storage capacitor and in the region which has the thick gate insulating film and becomes the driver TFT and the pixel TFT.

Figure 4B:
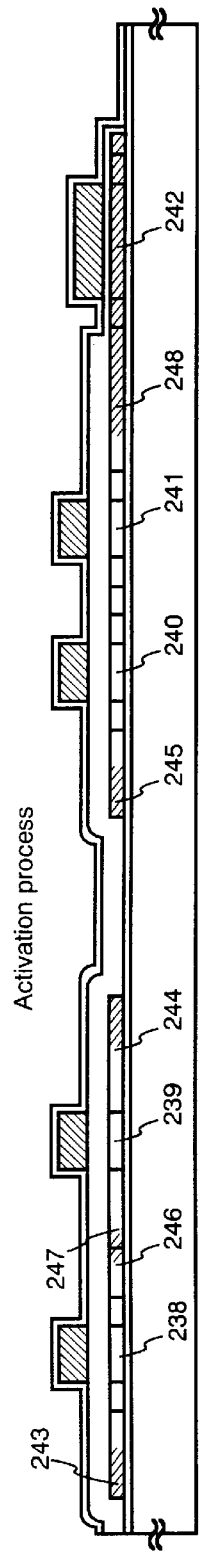

After all the impurity regions are formed in this way, the resist masks 233 and 234 are removed. Then, activation of the added impurities is carried out by laser light or a heat treatment. If only activation is carried out, a heat treatment within the temperature range of 300 to 700° C. for about 2 hours is sufficient. However, here, a heat treatment within the temperature range of 750 to 1150° C. for 20 minutes to 12 hours is carried out. In this embodiment, a heat treatment at 950° C. for 2 hours was carried out in an inert gas atmosphere (FIG. 4B).

This step serves to activate phosphorus or boron added to the respective impurity regions, and at the same time, also serves as a step of again gettering nickel (catalytic element used for crystallization) remaining in the channel formation region by the gettering function of phosphorus into the source region and the drain region. Besides, by carrying out the heat treatment within the temperature range of 750 to 1150° C., the impurity goes around into the portion under the gate wiring, so that it is also possible to form a structure having high reliability called GOLD (Gate-drain Overlapped LDD) structure.

The reason why the processing temperature is high is that the gettering function of phosphorus can not effectively work if a temperature of about ±50° C. from the highest temperature in the heat hysteresis given to the semiconductor layer in the period from the crystallizing step to the gettering step is not applied. In the case of this embodiment, since the heat hysteresis of 950° C. was given for the formation of the gate insulating film, the heat treatment at a temperature of 900 to 1000° C. is effective.

In this step, nickel is moved, and gettered and captured by phosphorus contained in the source region or the drain region. By this, the concentration of nickel contained in the channel formation regions 238 to 241 was reduced to $2\times10^{17}$ atoms/cm$^3$ or less (preferably $1\times10^{16}$ atoms/cm$^3$ or less). Thus, it does not have any influence on the operation of the TFT.

On the contrary, nickel is concentrated into the source regions 243 to 245 and the drain regions 246 to 248, and exists at a concentration of $1\times10^{19}$ atoms/cm$^3$ or more (typically $3\times10^{19}$ to $1\times10^{21}$ atoms/cm$^3$).

After the state of FIG. 4B is obtained in this way, a first interlayer insulating film 249 is formed. In this embodiment, a silicon oxide film having a thickness of 1 µm formed by a plasma CVD method was used. Then, after contact holes are formed, source wirings 250 to 252, and drain wirings 253 and 254 are formed. Each of these wirings is formed of a laminate film in which a conductive film containing aluminum as its main ingredient is sandwiched between titanium films.

At this time, the drain wiring 253 is used as a wiring common to both the NTFT and the PTFT constituting the CMOS circuit. As described above, since nickel is contained at a high concentration in the source region and the drain region, excellent ohmic contact to the source wiring and the drain wiring can be realized.

Thereafter, a passivation film 255 is formed. As the passivation film 255, a silicon nitride film, a silicon oxide nitride film, a silicon nitride oxide film, or a laminate film of such an insulating film and a silicon oxide film may be used. In this embodiment, a silicon nitride film having a thickness of 300 nm was used as the passivation film.

In this embodiment, as a pretreatment to formation of the silicon nitride film, a plasma treatment using ammonia gas is carried out, and the passivation film 255 is directly formed. By this pretreatment, since hydrogen activated (excited) by plasma is confined by the passivation film 255, hydrogen termination of the active layer (semiconductor layer) of the TFT can be accelerated.

Further, a nitrous oxide gas is added to the gas containing hydrogen, the surface of the object to be treated is cleaned by generated moisture, and especially pollution by boron contained in the air can be effectively prevented.

After the passivation film 255 is formed, an acrylic film having a thickness of 1 µm is formed as a second interlayer insulating film 256. Then, a titanium film having a thickness of 200 nm is formed thereon and patterning is carried out, so that a black mask 257 is formed.

Figure 4C:
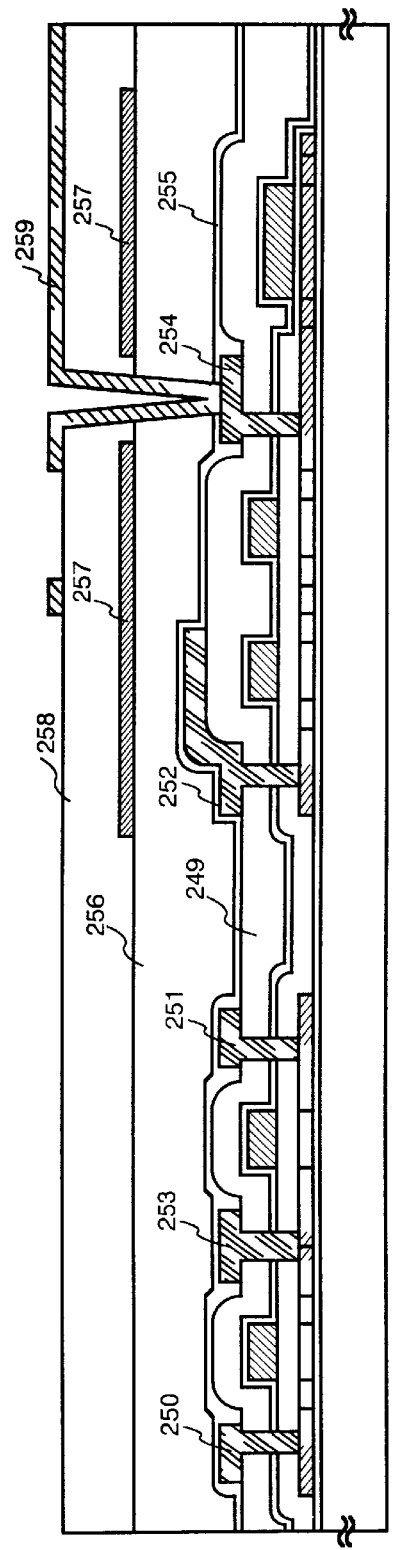

Next, an acrylic film having a thickness of 1 µm is again formed as a third interlayer insulating film 258, a contact hole is formed, and a pixel electrode 259 made of an ITO film is formed. In this way, an AM-LCD having a structure as shown in FIG. 4C is completed.

Like this, the present invention is characterized in that the adding step of the impurity to lower the nickel content serves also as the step of lowering the resistance of the lower electrode of the storage capacitor. By such structure, it becomes possible to increase the capacity of the storage capacitor without increasing the area.

Moreover, when the fabricating steps of this embodiment are employed, the active layer (semiconductor layer) of the final TFT is formed of a crystalline silicon film of a unique crystal structure having continuity in crystal lattices. The features will be described below.

The active layer formed in accordance with the above fabricating steps has microscopically a crystal structure in which a plurality of needle-like or rod-like crystals (hereinafter abbreviated to "rod-like crystal") are collected and arranged. This was easily ascertained by observation with a TEM (Transmission Electron Microscope).

It was also ascertained by using electron beam diffraction and X-ray diffraction that the surface (portion where a channel was formed) of the active layer had a main oriented plane of {110} plane although some deviation was included in crystal axes. As the result of the applicant's detailed observation for an electron beam diffraction photograph with a spot diameter of about 1.5 μm, it was ascertained that although diffraction spots corresponding to the {110} plane clearly appeared, the respective spots had a distribution on concentric circles.

The present applicant observed crystal grain boundaries formed through contact of the respective rod-like crystals by using an HR-TEM (High Resolution Transmission Electron Microscope), and it was ascertained that crystal lattices have continuity at the crystal grain boundaries. This was easily ascertained from the fact that the observed lattice stripes were continuously connected at the crystal grain boundaries.

The continuity of the crystal lattice at the crystal grain boundary is caused from the fact that the crystal grain boundary is a grain boundary called "planar boundary". The definition of the planar boundary in the present specification is "Planar boundary" disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988".

According to the above paper, the planar boundary includes a twin boundary, a specific laminate defect, a specific twist boundary, and the like. This planar boundary has a feature that it is electrically inactive. That is, since the planar boundary does not function as a trap to block the movement of a carrier though it is a crystal grain boundary, it can be regarded as not substantially existing.

Particularly in the case where a crystal axis (axis vertical to a crystal plane) is a <110> axis, a {211} twin boundary is also called a coincidence boundary of Σ3. The Σ value is a parameter which becomes an index showing the degree of conformity of the coincidence boundary, and it is known that as the Σ value becomes small, the conformity of the grain boundary becomes excellent.

As the result of the applicant's detailed observation with the TEM for a crystalline silicon film obtained by carrying out this embodiment, it was found that almost all (90% or more, typically 95% or more) crystal grain boundaries are coincidence boundaries of Σ3, that is, {211} twin boundaries.

In the crystal grain boundary formed between two crystal grains, and in the case where both crystals have a plane orientation of {110}, when an angle formed by lattice stripes corresponding to a {111} plane is θ, it is known that when θ=70.5°, the boundary becomes a coincidence boundary of Σ3.

In the crystalline silicon film of this embodiment, the respective lattice stripes of crystal grains adjacent at the crystal grain boundary were continuous at just about 70.5°, and from this, it was concluded that this crystal grain boundary was the {211} twin boundary.

Although a boundary becomes a coincidence boundary of Σ9 when θ=38.9°, such other crystal grain boundaries also existed.

Such a coincidence boundary is formed only between crystal grain boundaries of the same plane orientation. That is, since the crystalline silicon film obtained by carrying out this embodiment has substantially the uniform plane orientation of {110}, such a coincidence boundary can be formed over a wide range.

Such a crystal structure (correctly, structure of a crystal grain boundary) shows that two different crystal grains are connected to each other with extremely superior conformity at the crystal grain boundary. That is, such a structure is formed that crystal lattices are continuously connected at the crystal grain boundary and it is very hard to form a trap level due to a crystal defect etc. Thus, a semiconductor thin film with such a crystal structure can be regarded as substantially having no crystal grain boundary.

Besides, it is ascertained by TEM observation that defects existing in crystal grains almost disappear by the heat treatment step (corresponding to the thermal oxidation step or the gettering step in this embodiment) at a high temperature of 700 to 1150° C. This is obvious also from the fact that the number of defects is greatly decreased before and after this heat treatment step.

The difference in the number of defects appears as difference in spin density by electron spin resonance (ESR). In the present circumstances, it is found that the spin density of a crystalline silicon film fabricated in accordance with the fabricating steps of this embodiment is $5 \times 10^{17}$ spins/cm$^3$ or less (preferably $3 \times 10^{17}$ spins/cm$^3$ or less). However, since this measured value approximates the detection limit of existing measuring apparatuses, it is expected that an actual spin density is further low.

From the above, since the crystalline silicon film obtained by carrying out this embodiment does not substantially include crystal grains and crystal grain boundaries, the film can be regarded as a single crystal silicon film or substantially a single crystal silicon film.

(Findings as to Electrical Characteristics of a TFT)

A TFT fabricated in this embodiment exhibited electrical characteristics comparable to a MOSFET. Data as shown below have been obtained from a TFT (thickness of an active layer is 30 nm, thickness of a gate insulating film is 100 nm) experimentally formed by the present applicant.

(1) The subthreshold coefficient as an index showing switching performance (promptness in switching of on/off operation) is as small as 60 to 100 mV/decade (typically 60 to 85 mV/decade) for both an N-channel type TFT and a P-channel type TFT.

(2) The field effect mobility ($\mu_{FE}$) as an index showing an operation speed of a TFT is as large as 200 to 650 cm$^2$/Vs (typically 300 to 500 cm$^2$/Vs) for an N-channel type TFT, and 100 to 300 cm$^2$/Vs (typically 150 to 200 cm$^2$/Vs) for a P-channel type TFT.

(3) The threshold voltage (Vth) as an index of a driving voltage of a TFT is as small as −0.5 to 1.5 V for an N-channel type TFT and −1.5 to 0.5 V for a P-channel type TFT.

As described above, it has been ascertained that extremely superior switching characteristics and high speed operation characteristics can be realized.

(Findings as to Circuit Characteristics)

Next, frequency characteristics of a ring oscillator fabricated with TFTs formed by carrying out this embodiment will be described. The ring oscillator is a circuit in which an odd number of stages of inverter circuits made of CMOS structures are connected to form a ring, and is used to obtain a delay time for one stage of the inverter circuit. The structure of a ring oscillator used for experiment is as follows:

number of stages: 9 stages thickness of a gate insulating film of a TFT: 30 nm and 50 nm gate length (channel length) of a TFT: 0.6 μm As the result of study of an oscillation frequency with this ring oscillator, it was possible to obtain an oscillation frequency of 1 GHz at the maximum value. Further, a shift register as one of TEGs of LSI circuits was actually fabricated and its operation frequency was ascertained. As a result, in the shift register circuit in which the thickness of a gate insulating film was 30 nm, the gate length was 0.6 μm, the power source voltage was 5 V, and the number of stages was 50, an output pulse having an operation frequency of 100 MHZ was obtained.

The surprising data of the ring oscillator and the shift register as described above indicate that the TFT of this embodiment has performance (electrical characteristics) comparable to or superior to a MOSFET.

Embodiment 2

Figure 5A:
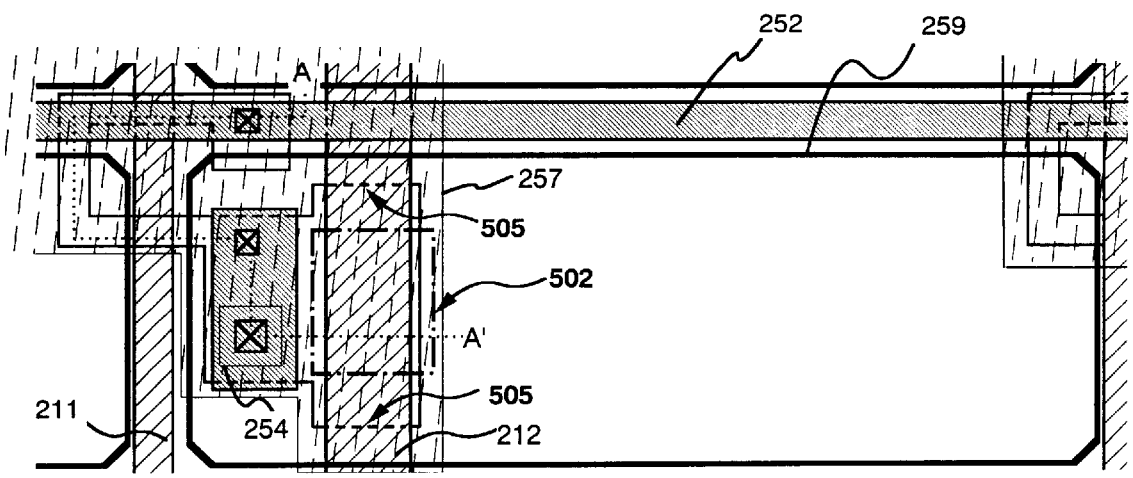
FIGS. 5A and 5B are a top view of a pixel matrix circuit and a view showing a circuit arrangement.
Figure 5B:
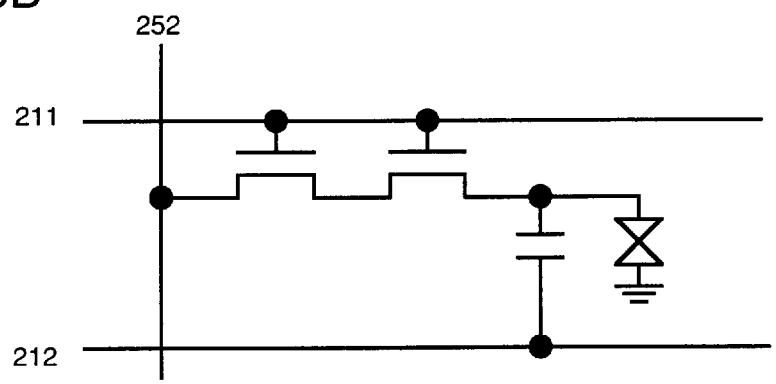

In the embodiment 1, at the step of selectively removing the gate insulating film 206, it is desirable that the removal in the region which becomes the storage capacitor is carried out as shown in FIG. 5A. In FIG. 5A, a section taken along dotted line A—A' in the top view of the pixel matrix circuit corresponds to the sectional view of the pixel matrix circuit of FIG. 4C. FIG. 5B is a simple equivalent circuit diagram of FIG. 5A. Reference numerals used in FIGS. 5A and 5B are the same as those of FIGS. 2A to 4C. In FIG. 5A, reference numeral 502 denotes an end portion of a gate insulating film; 211, a gate wiring; 212, an upper wiring of the storage capacitor; and 257, a black mask.

As shown in FIG. 5A, it is desirable that the gate insulating film is made to remain at the end portion of a semiconductor layer in a portion 505 where the gate wiring overstrides the semiconductor layer.

At the end portion of the semiconductor layer, a phenomenon called edge thinning occurs when a thermal oxidation step is later carried out. This is such a phenomenon that an oxidation reaction proceeds so as to intrude into a portion under the end portion of the semiconductor layer, so that the end portion becomes thin and at the same time, it swells upward. Thus, when the edge thinning phenomenon occurs, there occurs a problem that the gate wiring is apt to be broken at the time of overstriding.

However, if the gate insulating film 206 is removed so that the structure as shown in FIG. 5A is obtained, it is possible to prevent the edge thinning phenomenon at the portion 505 where the gate wiring overstrides the active layer. Thus, it is possible to prevent such a problem as breaking of the gate wiring from occurring.

Embodiment 3

In this embodiment, an example in which an AM-LCD is fabricated through steps different from the embodiment 1 will be described with reference to FIGS. 6A to 8C.

First, in accordance with the fabricating steps of the embodiment 1, a silicon oxide film (base film 602) and an amorphous silicon film (not shown) are continuously formed on a quartz substrate 601. A technique disclosed in Japanese Patent Unexamined Publication No. Hei. 9-312260 is used, nickel is selected as a catalytic element, and after the amorphous silicon film is crystallized, active layers 603 and 604 made of a crystalline silicon film are formed (FIG. 6A). Incidentally, FIG. 6A is the same as FIG. 2A of the embodiment 1.

Next, a gate insulating film 606 is formed by a plasma CVD method or a sputtering method. This gate insulating film 606 is an insulating film which comes to function as a gate insulating film of a pixel TFT, and its film thickness is made 50 to 200 nm. In this embodiment, a silicon oxide film having a thickness of 100 nm is used. Instead of only the silicon oxide film, a laminate structure in which a silicon nitride film is provided on the silicon oxide film may be adopted, or a silicon nitride oxide film in which nitrogen is added to the silicon oxide film may be used.

After the gate insulating film 606 is formed, as shown in FIG. 6C, resist masks 605a and 605b are formed on the active layers by using a photomask, and an adding step of an element in group 15 (in this embodiment, phosphorus) is carried out. Here, through doping is made through the gate insulating film. It is preferable that the concentration of phosphorus to be added is $5 \times 10^{18}$ to $1 \times 10^{20}$ atoms/cm$^3$ (preferably $1 \times 10^{19}$ to $5 \times 10^{19}$ atoms/cm$^3$). However, since the concentration of phosphorus to be added is changed according to temperature and time in a subsequent gettering step, and further, according to an area of a phosphorus doped region, the concentration is not limited to this range. In this way, regions where phosphorus was added (hereinafter referred to as "phosphorus doped region") 603b and 604b, and regions to be channel formation regions 603a and 604a are formed (FIG. 6C).

Incidentally, it is preferable to oxidize the surface of the active layer before the resist masks 605a and 605b are formed. When a silicon oxide film is provided in advance, adhesion between the active layer and the resist mask is raised, and further, it is possible to prevent the active layer from being polluted by an organic material.

Next, the gate insulating film 606 is selectively removed by using the resist masks 605a and 605b used for addition of phosphorus as they are. The resist mask 605a is provided on the active layer of a driver TFT, and is disposed in such a manner that a part (or all) of a region which subsequently becomes a source region or a drain region is exposed. The resist mask 605b is disposed in such a manner that a part (or all) of a region which subsequently becomes a source region or a drain region of the pixel TFT is exposed. At this time, a region which becomes a storage capacitor is exposed.

Next, the resist masks 605a and 605b are removed, and a heat treatment at 500 to 650° C. is applied for 2 to 16 hours, so that gettering of the catalytic element (in this embodiment, nickel) used for crystallization of the silicon film is carried out. As described also in the embodiment 1, in order to effect the gettering function, a temperature of about ±50° C. from the maximum temperature in the heat hysteresis is necessary. Since the heat treatment for crystallization is carried out at 550 to 600° C., the gettering function can be sufficiently obtained by the heat treatment of 500 to 650° C.

In this embodiment, a heat treatment at 600° C. for 8 hours is applied, so that nickel moves in the directions of arrows (shown in FIG. 6D) and was gettered into the phosphorus doped regions 603b and 604b. In this way, gettering regions are formed. This gettering region remains as a lower electrode of the storage capacitor, and remains as a part or the whole of the source region or drain region of the driver TFT and the pixel TFT FIG. 6D).

Next, a heat treatment step at 800 to 1150° C. (preferably 900 to 1100° C.) for 15 minutes to 8 hours (preferably 30 minutes to 2 hours) is carried out in an oxidizing atmosphere (thermal oxidation step). In this embodiment, a heat treatment step at 950° C. for 30 minutes was carried out in an oxygen atmosphere. In this heat treatment step, since such an effect can be obtained that defects etc. in crystal grains of the active layer are repaired, extremely excellent crystallinity is obtained.

As the oxidizing atmosphere, both a dry oxygen atmosphere and a wet oxygen atmosphere may be used, or an atmosphere in which a halogen element is contained in an oxygen atmosphere may be used. An effect of removing nickel is also expected in the thermal oxidation step with the atmosphere containing the halogen element, which is effective.

By carrying out the thermal oxidation step in this way, a silicon oxide film (thermal oxidation film) 607 having a thickness of 5 to 50 nm (preferably 10 to 30 nm) is formed on the surface of the semiconductor layer exposed at the region which becomes the pixel TFT, the driver TFT, and the storage capacitor (FIG. 7A). The silicon oxide film 607 finally functions as a dielectric of the storage capacitor, and the silicon oxide film 606 finally functions as the gate insulating film of the pixel TFT and the driver TFT.

Although not shown, an oxidation reaction proceeds also at the interface between the gate insulating film 606 made of the silicon oxide film remaining in the pixel TFT and the driver TFT and the semiconductor layers 603 and 604 thereunder. Thus, the thickness of the gate insulating film 606 of the pixel TFT finally becomes 50 to 200 nm (preferably 100 to 150 nm).

Since subsequent steps may comply with the steps of the embodiment 1, their detailed explanations are omitted.

After the thermal oxidation step is completed in this way, similarly to the embodiment 1, gate wirings 609 to 611, an upper wiring 612 of the storage capacitor, and a silicon nitride film 613 covering those wirings are formed (FIG. 7B).

Next, an amorphous silicon film is formed, anisotropic etching is carried out to form side walls 614 to 618, and an adding step of an element in group 15 (in this embodiment, phosphorus) is carried out, so that impurity regions 619 to 623 are formed in a self aligning manner (FIG. 7C).

Next, the side walls 614 to 618 are removed, and an adding step of phosphorus is again carried out, so that low concentration impurity regions 625, 632, 629a, and 629b are formed (FIG. 7D).

Figure 8A:
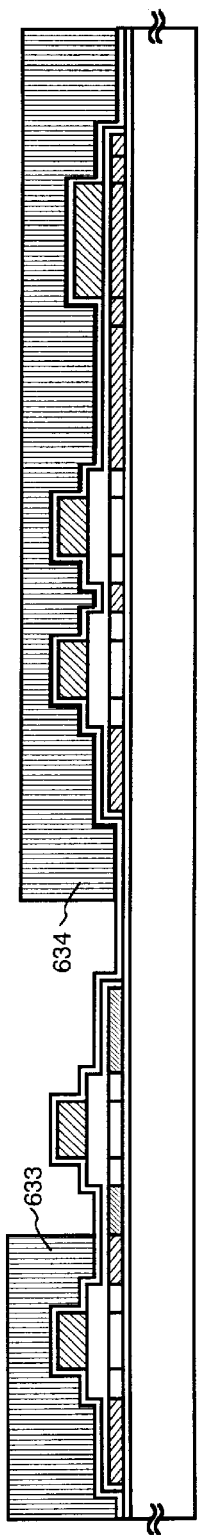
FIGS. 8A to 8C are views showing fabricating steps of the AM-LCD.

Next, regions except the region which becomes the PTFT of the CMOS circuit are concealed with resist masks 633 and 634, and an adding step of an element in group 13 (in this embodiment, boron) is carried out, so that an impurity region exhibiting P-type conductivity is formed (FIG. 8A).

Of course, similarly to the embodiment 1, the order of doping is not limited to this embodiment, but for example, after the step shown in FIG. 7B, a step of forming the low concentration impurity regions by addition of phosphorus may be carried out prior to the step of forming the side walls 614 to 618. Besides, the adding step of phosphorus may be carried out separately in the region which becomes the storage capacitor and in the region which becomes the driver TFT and the pixel TFT and has the thick gate insulating film.

Figure 8B:
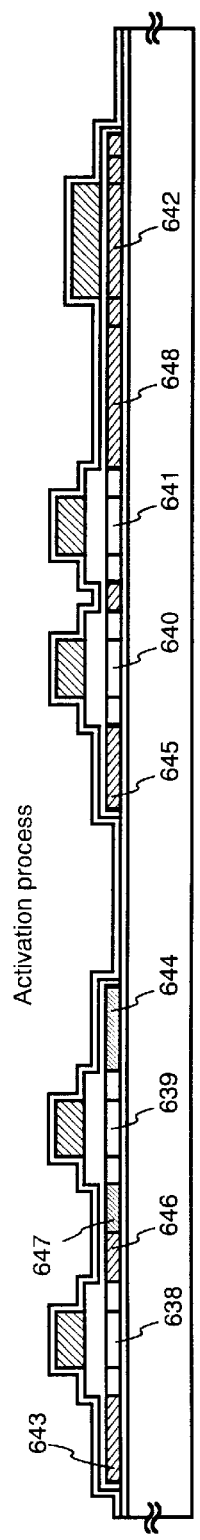

After all the impurity regions are formed in this way, the resist masks 633 and 634 are removed, and phosphorus or boron added to the respective impurity regions is activated by a heat treatment (300 to 700° C., several hours), or laser light, or the like (FIG. 8B). Such structure may be adopted that this activation is carried out by a heat treatment step at 800 to 1150° C. (preferably 900 to 1100° C.) for 15 minutes to 8 hours, so that an impurity is diffused to a portion under the gate wiring and an impurity region is formed similarly to the embodiment 1. Then channel formation regions 638 to 641, source regions 643 to 645, drain regions 646 to 648, and a lower electrode 642 are formed.

After the state of FIG. 8B is obtained in this way, a first interlayer insulating film 649 is formed. Then, after contact holes are formed, source wirings 650 to 652, and drain wirings 653 and 654 are formed.

Thereafter, a passivation film 655 is formed. After the passivation film 655 is formed, an acrylic film having a thickness of 1 μm is formed as a second interlayer insulating film 656. Then, a titanium film having a thickness of 200 nm is formed thereon and patterning is carried out, so that a black mask 657 is formed.

Figure 8C:
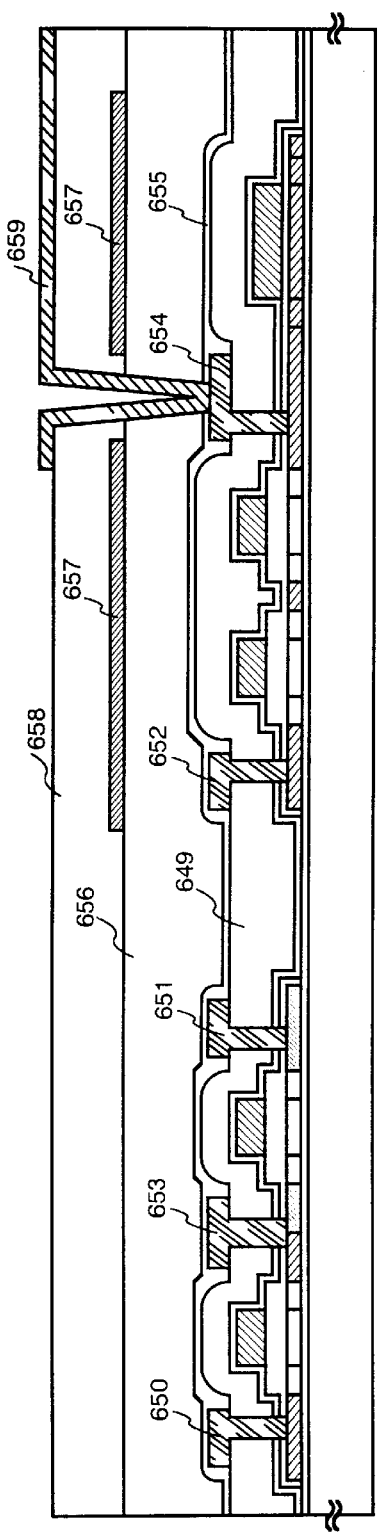

Next, an acrylic film having a thickness of 1 μm is again formed as a third interlayer insulating film 658, a contact hole is formed, and a pixel electrode 659 made of an ITO film is formed. In this way, an AM-LCD having a structure as shown in FIG. 8C is completed.

The different point between the embodiment 1 and this embodiment is that the mask used for the adding step of phosphorus for the gettering step is also used as the mask for the step of removing the insulating film in order to expose the lower electrode of the storage capacitor. By doing so, the number of masks can be reduced.

Incidentally, the structure of this embodiment can be freely combined with any of the embodiments 1 and 2.

Embodiment 4

In the fabricating step of FIG. 2C of the embodiment 1, it is also possible to previously form a gate insulating film (corresponding to the gate insulating film 206 of FIG. 2D) to cover the active layer after the resist masks 205a and 205b are removed and before the heat treatment (gettering step) is carried out.

That is, the gettering step is carried out while the active layer is covered with the gate insulating film. After the gettering step is ended, patterning of the gate insulating film is carried out, and the structure similar to FIG. 4C is obtained.

The merit of this embodiment is that the active layer is not exposed at the time of the gettering step. In the case where the active layer is exposed, according to conditions such as processing temperature or processing atmosphere, there is a fear that phosphorus existing in the phosphorus doped region diffuses in the atmosphere, and is added to a region which subsequently becomes a channel formation region. However, if the active layer is covered with the gate insulating film as in this embodiment, such a problem does not occur.

Incidentally, the structure of this embodiment can be freely combined with any of the embodiments 1 to 3.

Embodiment 5

In this embodiment, a description will be made on a case where TFTs are formed on a substrate through the fabricating steps shown in the embodiment 1, and an AM-LCD is actually fabricated.

After the state of FIG. 4C is obtained, an alignment layer having a thickness of 80 nm is formed on the pixel electrode 259. Next, an opposite substrate in which a color filter, a transparent electrode (opposite electrode), and an alignment layer are formed on a glass substrate is prepared. Rubbing processing is carried out to the respective alignment layers, and the substrate on which the TFTs are formed is bonded to the opposite substrate by using a sealing material (sealant). Then, a liquid crystal is held therebetween. Since well-known means may be used for this cell assembling step, its detailed description is omitted.

A spacer for maintaining a cell gap may be provided as the need arises. Thus, in the case where the cell gap can be maintained without the spacer as in the AM-LCD having a size of 1 inch in diagonal, it is not necessary to particularly provide the spacer.

Figure 9:
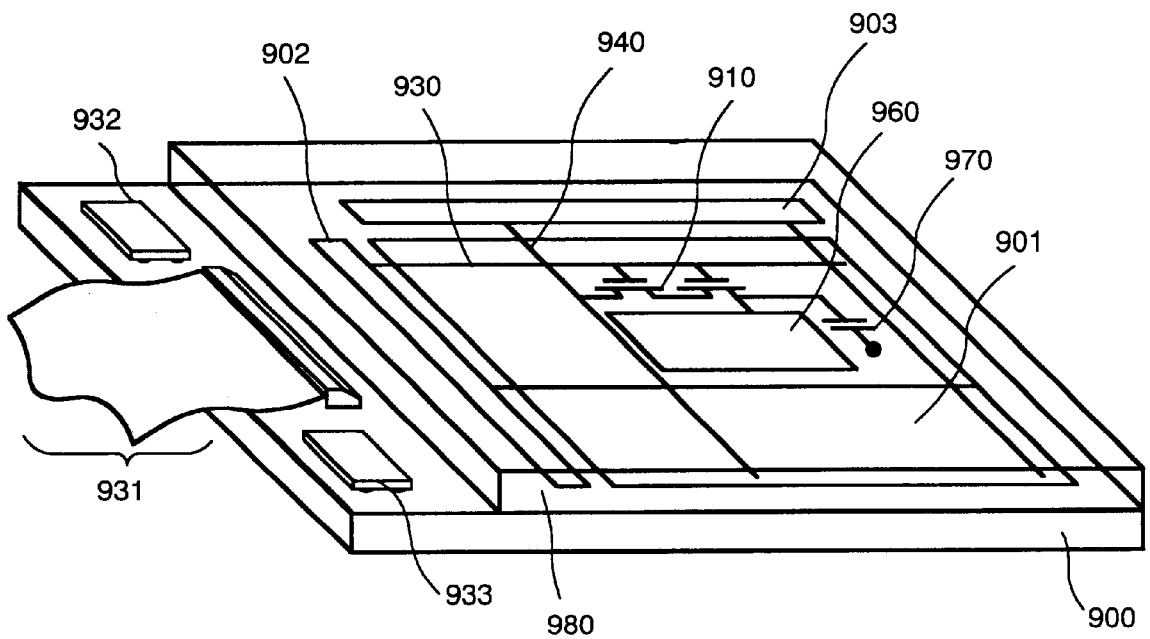
FIG. 9 is a view showing an outer appearance of an AM-LCD.

Next, FIG. 9 shows an outer appearance of an AM-LCD fabricated in the manner as described above. As shown in FIG. 9, an active matrix substrate and an opposite substrate are opposite to each other, and a liquid crystal is held between these substrates. The active matrix substrate includes a pixel matrix circuit 901, a scanning line driver circuit 902, and a signal line driver circuit 903 formed on a substrate 900.

The scanning line driver circuit 902 and the signal line driver circuit 903 are respectively connected to the pixel matrix circuit 901 through a scanning line 930 and a signal line 940. These driver circuits 902 and 903 are mainly constituted by CMOS circuits.

The scanning line is formed for every row of the pixel matrix circuit 901, and the signal line 940 is formed for every column. A pixel TFT 910 is formed in the vicinity of a crossing portion of the scanning line 930 and the signal line 940. A gate electrode of the pixel TFT 910 is connected to the scanning line 930, and its source is connected to the signal line 940. Further, a pixel electrode 960 and a storage capacitor 970 are connected to the drain.

With respect to an opposite substrate 980, a transparent conductive film such as an ITO film is formed on the entire surface of the substrate. The transparent conductive film is an opposite electrode to the pixel electrode 960 of the pixel matrix circuit 901, and the liquid crystal material is driven by an electric field formed between the pixel electrode and the opposite electrode. Further, as the need arises, an alignment layer, a black mask, and a color filter are formed on the opposite substrate 980.

IC chips 932 and 933 are attached to the substrate on the active matrix substrate side by using a surface to which an FPC 931 is attached. These IC chips 932 and 933 are constructed by forming circuits, such as a processing circuit of a video signal, a timing pulse generating circuit, a γ-correction circuit, a memory circuit, and an arithmetic circuit, on a silicon substrate.

In this embodiment, although the description has been made on the liquid crystal display device as an example, as long as the device is an active matrix type display device, the present invention can also be applied to an EL (electroluminescence) display device or an EC (electrochromic) display device.

Incidentally, the structure of this embodiment can be freely combined with any of the embodiments 1 to 4.

Embodiment 6

In this embodiment, a description will be made on a case where another means is used for formation of a crystalline silicon film in the embodiment 1.

Specifically, a technique disclosed in embodiment 2 of Japanese Patent Unexamined Publication No. Hei. 7-130652 (corresponding to U.S. Pat. Ser. No. 08/329,644) is used for crystallization of an amorphous silicon film. The technique disclosed in the publication is such a technique that a catalytic element (typically nickel) for promoting crystallization is selectively held on the surface of an amorphous silicon film, and crystallization is carried out with the portion as a seed of nuclear growth.

According to this technique, since specified directionality can be given to crystal growth, it is possible to form a crystalline silicon film having extremely high crtystallinity.

Incidentally, the structure of this embodiment can be freely combined with any of the embodiments 1 to 5.

Embodiment 7

The present invention can also be used in the case where an interlayer insulating film is formed on a conventional MOSFET and a TFT is formed thereon. That is, it is also possible to realize a semiconductor device with a three-dimensional structure in which a reflective type AM-LCD is formed on a semiconductor circuit.

The semiconductor circuit may be formed on a SOI substrate such as SIMOX, Smart-Cut (registered trademark of SOITEC Inc.), or ELTRAN (registered trademark of Cannon Inc.).

Incidentally, in carrying out this embodiment, any structure of the embodiments 1 to 6 may be combined.

Embodiment 8

In this embodiment, a description will be made on an example in which a source region and a drain region are formed by adding an element in group 13 or group 15 in order different from the embodiment 1. The order of doping in the embodiment 1 is such that phosphorus of high concentration is first added, phosphorus of low concentration is secondly added, and boron is thirdly added. In this embodiment, an example in which boron is first added after the state of FIG. 3B is obtained, will be described.

First, in accordance with the steps of the embodiment 1, the state of FIG. 3B is obtained.

Next, a resist mask covering a region other than the PTFT is formed. Then, an adding step of boron is carried out. At this time, the concentration of boron to be added is $1 \times 10^{20}$ to $3 \times 10^{21}$ atoms/cm$^3$. In this way, a source region, a drain region, and a channel formation region of the PTFT are defined.

Next, the resist mask is removed, and similarly to the embodiment 1, side walls are formed. Then, an adding step of phosphorus is carried out. At this time, the concentration of phosphorus to be added is $5 \times 10^{19}$ to $1 \times 10^{21}$ atoms/cm$^3$.

Next, the side walls are removed, and an adding step of phosphorus is again carried out. At this time, the concentration of phosphorus to be added is $5 \times 10^{17}$ to $1 \times 10^{18}$ atoms/cm$^3$.

The subsequent steps may comply with the fabricating steps of the embodiment 1. The structure of this embodiment can be freely combined with any of the embodiments 1 to 8.

Incidentally, in this embodiment, such modification may be made that a step of forming an impurity region by adding phosphorus (the concentration of phosphorus is $5 \times 10^{17}$ to $5 \times 10^{18}$ atoms/cm$^3$) is carried out prior to the forming step of the side walls, and after formation of the side walls, phosphorus is again added to form an impurity region (the concentration of phosphorus is $5 \times 10^{19}$ to $1 \times 10^{21}$ atoms/cm$^3$).

In the case where this embodiment is applied to the embodiment 3, after the state of FIG. 7B is obtained, it is sufficient if doping is carried out in the same manner.

Embodiment 9

In this embodiment, a description will be made on an example in which a source region and a drain region are formed by adding an element in group 13 or group 15 in order different from the embodiment 1. The order of doping in the embodiment 1 is such that phosphorus of high concentration is first added, phosphorus of low concentration is secondly added, and boron is thirdly added. In this embodiment, an example in which after the state of FIG. 3B is obtained, phosphorus is first added, boron is secondly added, and phosphorus is again added thirdly, will be described.

First, in accordance with the steps of the embodiment 1, the state of FIG. 3B is obtained.

Next, a step of forming an impurity region by adding phosphorus (the concentration of phosphorus is $5\times10^{17}$ to $5\times10^{18}$ atoms/cm$^3$) is carried out.

Next, a resist mask covering a region other than a PTFT is formed. Then, an adding step of boron is carried out. At this time, the concentration of boron to be added is $1\times10^{20}$ to $3\times10^{21}$ atoms/cm$^3$. In this way, a source region, a drain region, and a channel formation region of the PTFT are defined.

Next, the resist mask is removed, and similarly to the embodiment 1, side walls are formed. Then, an adding step of phosphorus is carried out. At this time, the concentration of phosphorus to be added is $5\times10^{19}$ to $1\times10^{21}$ atoms/cm$^3$.

The subsequent steps may comply with the fabricating steps of the embodiment 1. The structure of this embodiment can be freely combined with any of the embodiments 1 to 7.

Embodiment 10

In the fabricating steps shown in the embodiment 1 or 3, although the side wall is used for formation of the LDD region, it is also possible to form the LDD region by patterning using a normal resist mask.

The structure of this embodiment can be freely combined with any of the embodiments 1 to 9.

In this case, it is possible to freely design the width (length) of the LDD region as compared with the case where the side wall is used. Thus, it can be said to be an effective technique in the case where the width of the LDD region is designed to be 0.1 $\mu$m or more.

Embodiment 11

An example of the formation of a first interlayer insulating film by a method differing from that of embodiment 1 is explained. FIGS. 10A and 10B are used in the explanation.

First, in accordance with the manufacturing processes of embodiment 1, processes shown in FIG. 3B are completed. A nitrified silicon oxide film A 1701 is formed to between 50 and 100 nm (70 nm in the present embodiment), and a nitrified silicon oxide film B 1702 is formed on top to between 600 nm and 1 mm (800 nm in the present embodiment). In addition, a resist mask 1703 is formed on top of that. (See FIG. 10A.)

Note that the composition ratio of nitrogen, oxygen, hydrogen, and silicon contained in the nitrified silicon oxide film A 1701 and the nitrified silicon oxide film B 1702 differs. The nitrified silicon oxide film A 1701 is 7% nitrogen, 59% oxygen, 2% hydrogen, and 32% silicon, while the nitrified silicon oxide film B 1702 is 33% nitrogen, 15% oxygen, 23% hydrogen, and 29% silicon. Of course, the composition ratios are not limited to these.

In addition, the film thickness of the resist mask 1703 is thick, so that undulations in the surface of the nitrified silicon oxide film B 1702 can be completely flattened.

Etching of the resist mask 1703 and the nitrified silicon oxide film B 1702 is performed next by dry etching with a mixed gas of carbon tetrafluoride and oxygen. For the case of embodiment 11, the etching rates of the nitrified silicon oxide film B 1702 and the resist mask 1703 are almost equal by dry etching using a mixed gas of carbon tetrafluoride and oxygen.

The resist mask 1703 is completely removed by this etching process, and a portion of the nitrified silicon oxide film B 1702 (in embodiment 16, to a depth of 300 nm from the surface) is etched, as shown in FIG. 10B. As a result, the flatness of the surface of the resist mask 1703 is reflected in the flatness of the surface of the nitrified silicon oxide film B 1702, which is etched as it is.

Thus a first interlayer insulating film 1704, having very high flatness, can be obtained. The film thickness of the first interlayer insulating film 1704 is 500 nm in the present embodiment. The manufacturing processes of embodiment 1 may be referred to for further processing.

Embodiment 12

A CMOS circuit and a pixel portion formed by carrying out the present invention can be used for various electro-optical devices (active matrix type liquid crystal display, active matrix type EL display, active matrix type EC display). That is, the present invention can be applied to any electronic equipments incorporating those electro-optical devices in the display portions.

As such electronic equipments, a video camera, a digital camera, a projector (rear type or front type), a head mount display (goggle type display), a car navigation system, a car stereo, a personal computer, a portable information terminal (mobile computer, portable telephone, electronic book, etc.), and the like can be enumerated. Examples of those are shown in FIGS. 11A to 11F, FIGS. 12A to 12D, and FIGS. 13A to 13C.

Figure 11A:
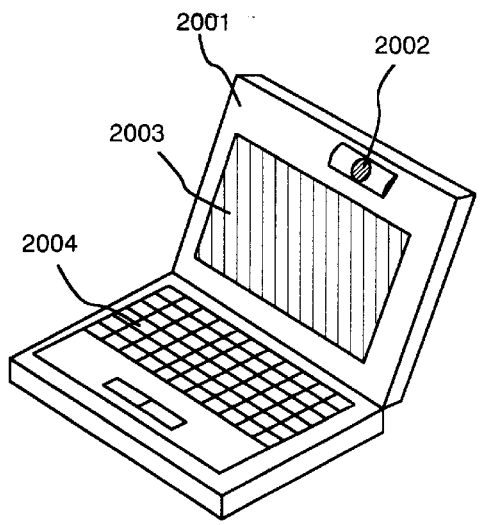
FIGS. 11A to 11F are views showing examples of electronic equipments.

FIG. 11A shows a personal computer which includes a main body 2001, an image input portion 2002, a display portion 2003, a keyboard 2004, and the like. The present invention can be applied to the image input portion 2002, the display portion 2003, and other signal control circuits.

Figure 11B:
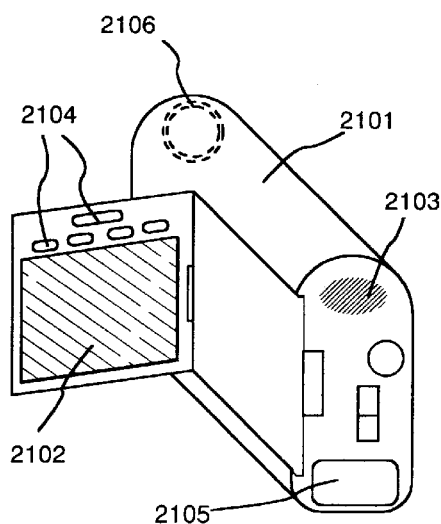

FIG. 11B shows a video camera which includes a main body 2101, a display portion 2102, an audio input portion 2103, an operation switch 2104, a battery 2105, an image receiving portion 2106, and the like. The present invention can be applied to the display portion 2102 and other signal control circuits.

Figure 11C:
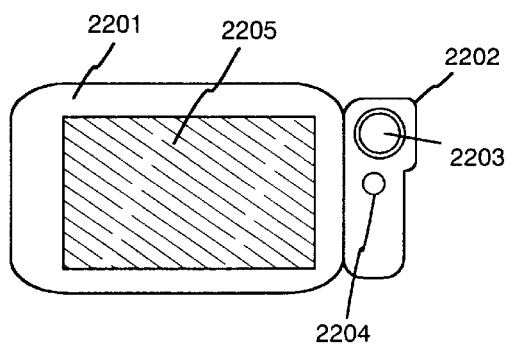

FIG. 11C shows a mobile computer which includes a main body 2201, a camera portion 2202, an image receiving portion 2203, an operation switch 2204, a display portion 2205, and the like. The present invention can be applied to the display portion 2205 and other signal control circuits.

Figure 11D:
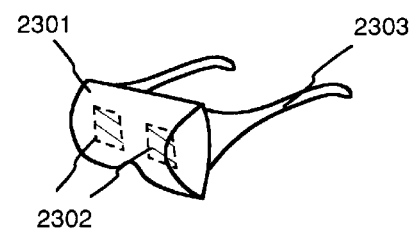

FIG. 11D shows a goggle type display which includes a main body 2301, a display portion 2302, an arm portion 2303, and the like. The present invention can be applied to the display portion 2302 and other signal control circuits.

Figure 11E:
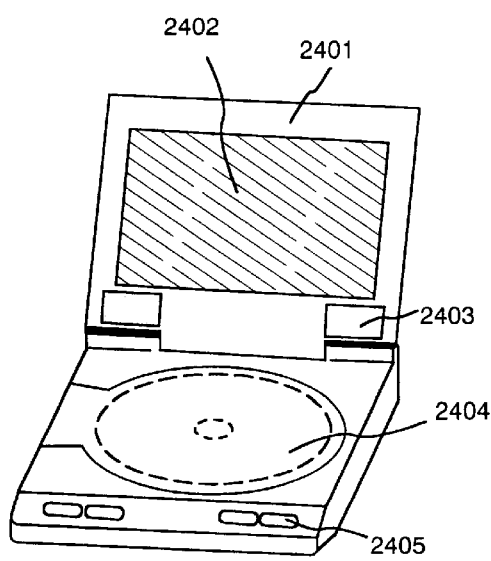

FIG. 11E shows a player using a recording medium in which a program is recorded (hereinafter referred to as a "recording medium"), which includes a main body 2401, a display portion 2402, a speaker portion 2403, a recording medium 2404, an operation switch 2405, and the like. This apparatus uses a DVD (Digital Versatile Disc), CD, or the like as the recording medium, and appreciation of music, appreciation of movie, a game, or the Internet can be performed. The present invention can be applied to the display portion 2402 and other signal control circuits.

Figure 11F:
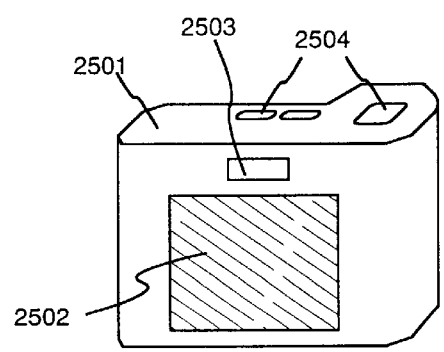

FIG. 11F shows a digital camera which includes a main body 2501, a display portion 2502, an eyepiece portion 2503, an operation switch 2504, an image receiving portion (not shown), and the like. The present invention can be applied to the display portion 2502 and other signal control circuits.

Figure 12A:
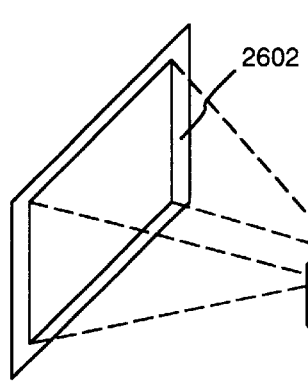
FIGS. 12A to 12D are views showing examples of electronic equipments.

FIG. 12A shows a front type projector which includes a projection device 2601, a screen 2602, and the like. The present invention can be applied to a liquid crystal display device 2808 in FIG. 12C constituting a part of the projection device 2601, and other signal control circuits.

Figure 12B:
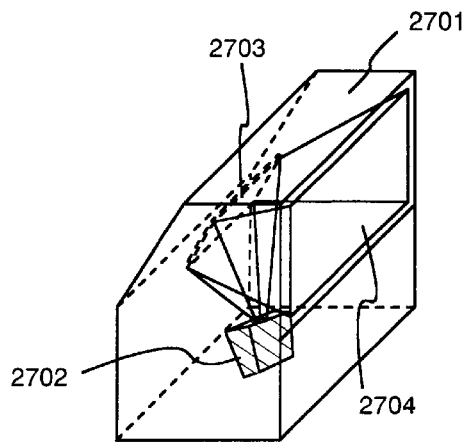

FIG. 12B shows a rear type projector which includes a main body 2701, a projection device 2702, a mirror 2703, a screen 2704, and the like. The present invention can be applied to a liquid crystal display device 2808 in FIG. 12C constituting a part of the projection device 2702 and other signal control circuits.

Figure 12C:
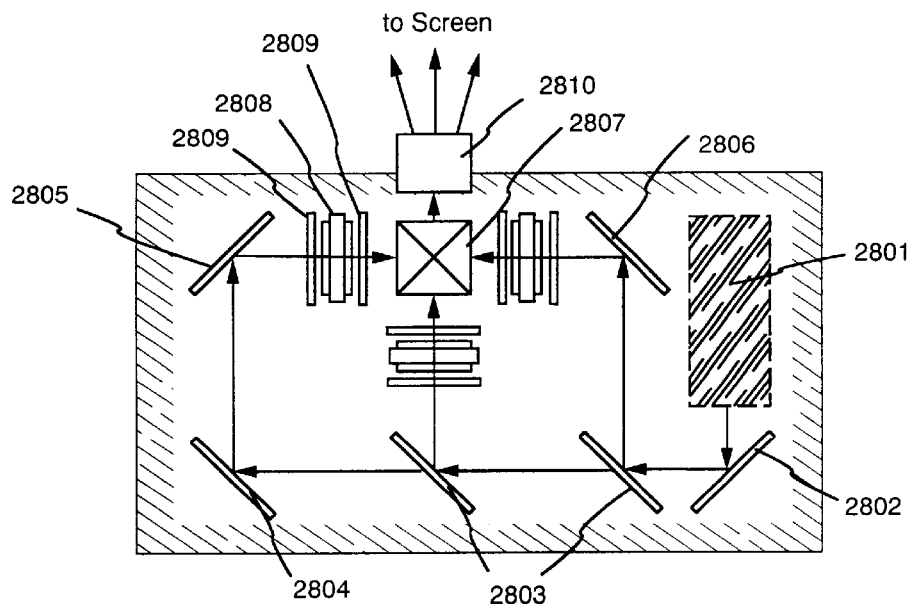

FIG. 12C is a view showing an example of structures of the projection devices 2601 and 2702 in FIG. 12A and FIG. 12B. Each of the projection devices 2601 and 2702 is constituted by a light source optical system 2801, mirrors 2802, 2804 to 2806, a dichroic mirror 2803, a prism 2807, a liquid crystal display device 2808, a phase difference plate 2809, and a projection optical system 2810. The projection optical system 2810 is constituted by an optical system including a projection lens. Although this embodiment shows an example of a three-plate system, the invention is not particularly limited to this. For example, a single plate system may be used. Besides, in a light path indicated by an arrow in FIG. 12C, an operator may suitably provide an optical system such as an optical lens, a film having a polarizing function, a film for adjusting a phase difference, or an IR film.

Figure 12D:
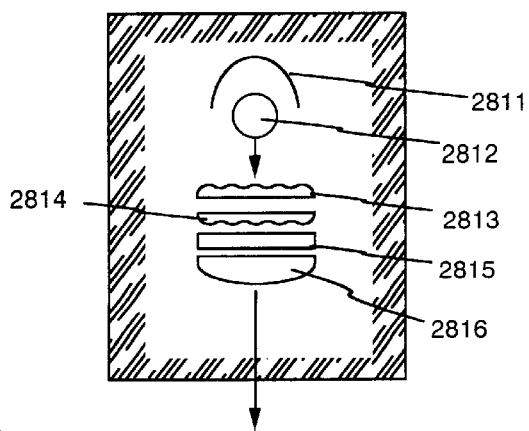

FIG. 12D is a view showing an example of a structure of the light source optical system 2801 in FIG. 12C. In this embodiment, the light source optical system 2801 is constituted by a reflector 2811, a light source 2812, lens arrays 2813 and 2814, a polarization conversion element 2815, and a condensing lens 2816. The light source optical system shown in FIG. 12D is merely an example, and the invention is not particularly limited to this. For example, an operator may suitably provide an optical system, such as an optical lens, a film having a polarizing function, a film for adjusting a phase difference, or an IR film, in the light source optical system.

However, in the projector shown in FIGS. 12A and 12B, a case where a transmission type electro-optical device is used is shown, and an application example in a reflection type electro-optical device and an EL display device is not shown.

Figure 13A:
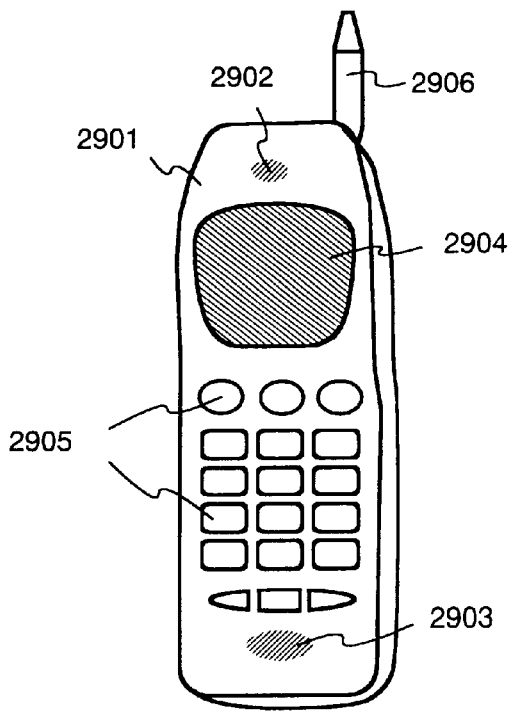
FIGS. 13A to 13C are views showing examples of electronic equipments.

FIG. 13A shows a portable telephone which includes a main body 2901, an audio output portion 2902, an audio input portion 2903, a display portion 2904, an operation switch 2905, an antenna 2906, and the like. The present invention can be applied to the audio output portion 2902, the audio input portion 2903, the display portion 2904, and other signal control circuits.

Figure 13B:
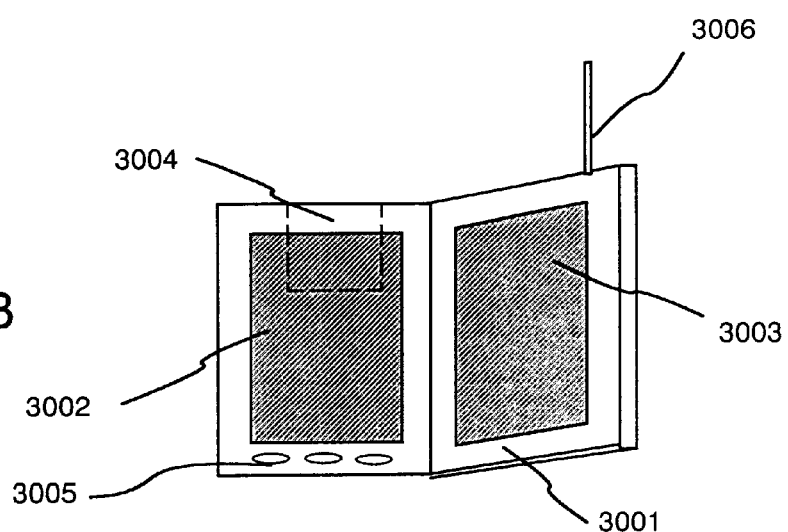

FIG. 13B shows a portable book (electronic book) which includes a main body 3001, display portions 3002 and 3003, a storage medium 3004, an operation switch 3005, an antenna 3006, and the like. The present invention can be applied to the display portions 3002 and 3003, and other signal circuits.

Figure 13C:
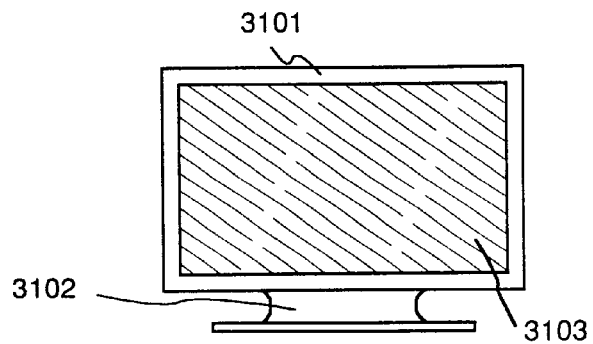

FIG. 13C shows a display which includes a main body 3101, a support stand 3102, a display portion 3103, and the like. The present invention can be applied to the display portion 3103. The display of the present invention is advantageous especially in the case of a large screen, and is advantageous for a display having a size of 10 inches or more in diagonal (especially 30 inches or more).

As described above, an applied range of the present invention is extremely wide, and the invention can be applied to electronic equipments in any fields.

Embodiment 13

In this embodiment, a description will be made on an example in which an EL (electroluminescence) display device is fabricated by using the present invention.

Figure 14A:
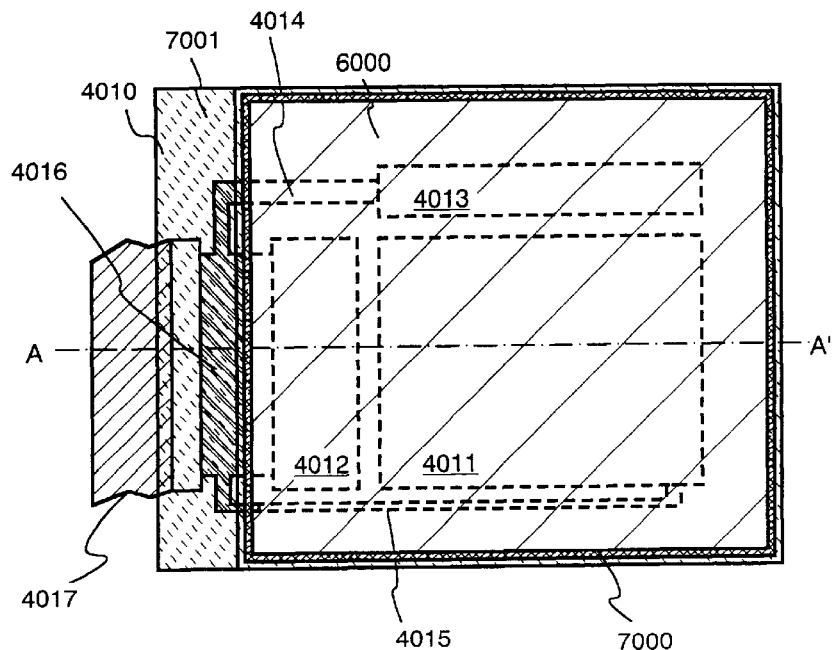
FIGS. 14A and 14B are views showing an EL display device.

FIG. 14A is a top view of an EL display device using the present invention. In FIG. 14A, reference numeral 4010 designates a substrate; 4011, a pixel portion; 4012, a source side driver circuit; and 4013, a gate side driver circuit. The respective driver circuits lead to an FPC 4017 through wirings 4014 to 4016 and are connected to an external equipment.

At this time, a cover material 6000, a sealing material (also called a housing material) 7000, and a sealant (second sealing material) 7001 are provided so as to surround at least the pixel portion, preferably the driver circuits and the pixel portion.

Figure 14B:
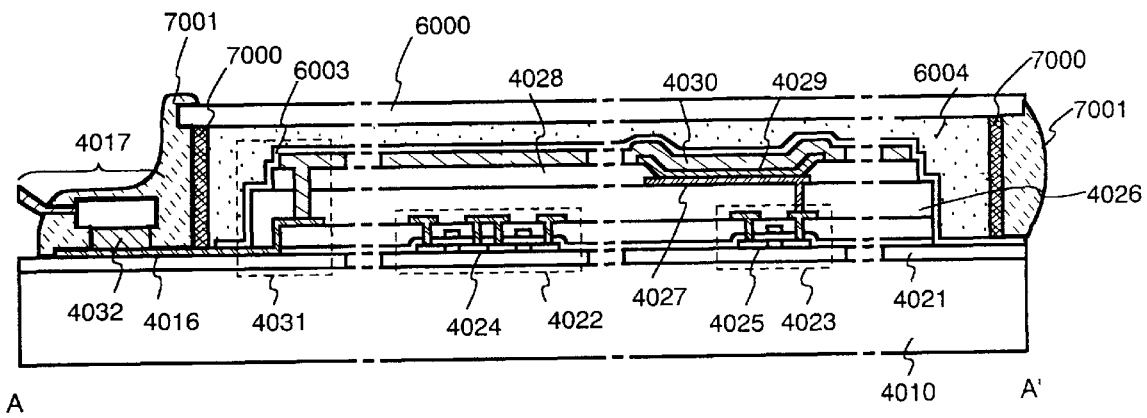

FIG. 14B is a view showing a sectional structure of the EL display device of this embodiment. A driver circuit TFT (here, a CMOS circuit in which an n-channel type TFT and a p-channel type TFT are combined is shown) 4022 and a pixel portion TFT 4023 (here, only a TFT for controlling current to an EL device is shown) are formed on a base film 4021 of the substrate 4010. A well known structure (top gate structure or bottom gate structure) may be used for these TFTs.

The present invention can be used for the driver circuit TFT 4022 and the pixel portion TFT 4023.

After the driver circuit TFT 4022 and the pixel portion TFT 4023 are completed by using the present invention, a pixel electrode 4027 made of a transparent conductive film electrically connected to a drain of the pixel portion TFT 4023 is formed on an interlayer insulating film (flattening film) 4026 made of resin material. As the transparent conductive film, a compound (called ITO) of indium oxide and tin oxide or a compound of indium oxide and zinc oxide can be used. After the pixel electrode 4027 is formed, an insulating film 4028 is formed, and an opening portion is formed on the pixel electrode 4027.

Next, an EL layer 4029 is formed. The EL layer 4029 may be made of a laminate structure by freely combining well-known EL materials (a hole injection layer, a hole transport layer, a light emitting layer, an electron transport layer, or an electron injection layer) or a single-layer structure. A well-known technique may be used to determine what structure is formed. The EL material includes a low molecular material and a high molecular (polymer) material. In the case where the low molecular material is used, an evaporation method is used. In the case where the high molecular material is used, it is possible to use a simple method such as a spin coating method, a printing method, or an ink jet method.

In this embodiment, the EL layer is formed by using a shadow mask and by an evaporation method. A light-emitting layer (a red light-emitting layer, a green light-emitting layer, and a blue light-emitting layer) capable of emitting light with different wavelengths is formed for every pixel by using the shadow mask, so that color display becomes possible. In addition to that, there are a system in which a color conversion layer (CCM) and a color filter are combined, and a system in which a white light-emitting layer and a color filter are combined, and any of the methods may be used. Of course, an EL display device of monochromatic emission of light may be made.

After the EL layer 4029 is formed, a cathode 4030 is formed thereon. It is desirable that moisture and oxygen existing at the interface between the cathode 4030 and the EL layer 4029 is removed to the utmost degree. Thus, such contrivance is necessary that the EL layer 4029 and the cathode 4030 are continuously formed in vacuum, or the EL layer 4029 is formed in an inert gas atmosphere and the cathode 4030 is formed without opening to the air. In this embodiment, a multi-chamber system (cluster tool system) film forming apparatus is used so that the foregoing film formation is made possible.

In this embodiment, a laminate structure of a LiF (lithium fluoride) film and an Al (aluminum) film is used for the cathode 4030. Specifically, a LiF (lithium fluoride) film having a thickness of 1 nm is formed on the EL layer 4029 by an evaporation method, and an aluminum film having a thickness of 300 nm is formed thereon. Of course, a MgAg electrode of a well-known cathode material may be used. The cathode 4030 is connected to the wiring 4016 in a region designated by 4031. The wiring 4016 is a power source supply line for supplying a predetermined voltage to the cathode 4030, and is connected to the FPC 4017 through a conductive paste material 4032.

For the purpose of electrically connecting the cathode 4030 to the wiring 4016 in the region 4031, it is necessary to form a contact hole in the interlayer insulating film 4026 and the insulating film 4028. This may be formed at the time of etching of the interlayer insulating film 4026 (at the time of formation of the contact hole for the pixel electrode) and at the time of etching of the insulating film 4028 (at the time of formation of the opening portion prior to the formation of the EL layer). Besides, when the insulating film 4028 is etched, the interlayer insulating film 4026 may also be etched at the same time. In this case, if the interlayer insulating film 4026 and the insulating film 4028 are made of the same resin material, the shape of the contact hole can be made excellent.

A passivation film 6003, a filler 6004, and a cover material 6000 are formed to cover the surface of the thus formed EL device.

Further, a sealing material 7000 is provided at the inside of the cover material 6000 and the substrate 4010 so as to surround the EL device portion, and further, a sealant (second sealing material) 7001 is formed at the outside of the sealing material 7000.

At this time, this filler 6004 functions also as an adhesive for bonding the cover material 6000. As the filler 6004, PVC (polyvinyl chloride), epoxy resin, silicone resin, PVB (polyvinyl butyral), or EVA (ethylene-vinyl acetate) may be used. If a drying agent is provided in the inside of the filler 6004, a moisture absorption effect can be expected, which is preferable.

A spacer may be contained in the filler 6004. At this time, the spacer is made to be granular material made of BaO etc. and the spacer itself may be made to have moisture absorption property.

In the case where the spacer is provided, the passivation film 6003 can relieve spacer pressure. In addition to the passivation film, a resin film or the like to relieve the space pressure may be provided.

As the cover material 6000, a glass plate, an aluminum plate, a stainless plate, an FRP (Fiberglass-Reinforced Plastics) plate, a PVF (polyvinyl fluoride) film, a Mylar film, a polyester film, or an acrylic film may be used. In the case where PVB or EVA is used for the filler 6004, it is preferable to use a sheet having such a structure that an aluminum foil with a thickness of several tens $\mu$m is sandwiched between PVF films or Mylar films.

However, according to the direction of light emission (direction of light radiation) from the EL device, it is necessary that the cover material 6000 has transparency.

The wiring 4016 is electrically connected to the FPC 4017 through the gap between the substrate 4010 and each of the sealing material 7000 and the sealant 7001. Here, although the description has been made on the wiring 4016, the other wirings 4014 and 4015 are also electrically connected to the FPC 4017 through the portion under the sealing material 7000 and the sealant 7001 in the same manner.

Incidentally, the structure of this embodiment can be carried out by being freely combined with the structure of the embodiments 1 to 4. It is effective to use the EL display panel having the pixel structure of this embodiment as the display portion of the electronic equipment of the embodiment 12.

Embodiment 14

For the foregoing liquid crystal display device of the present invention, various liquid crystals other than a nematic liquid crystal can be used. For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; or U.S. Pat. No. 5,594,569.

Figure 15:
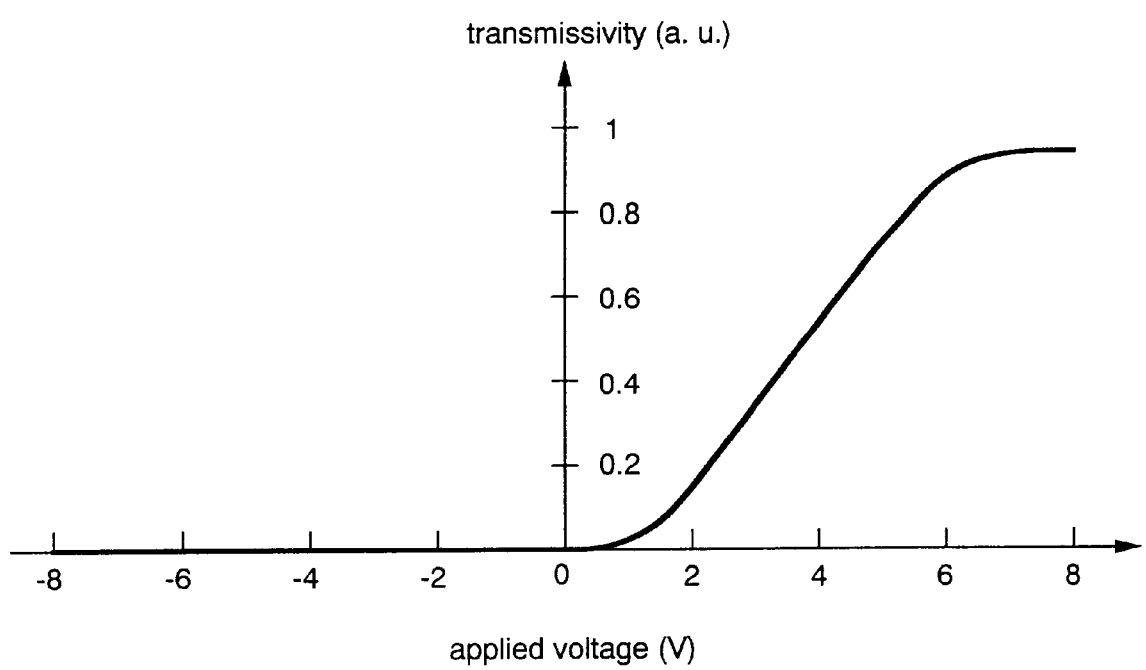
FIG. 15 is a view showing an example of light transmittance characteristics of an antiferroelectric mixed liquid crystal.

FIG. 15 shows electro-optical characteristics of single stable ferroelectric liquid crystal (FLC) in which the ferroelectric liquid crystal (FLC) exhibiting a transition series of isometric phase—cholesteric phase—chiral smectic C phase is used, transition of cholesteric phase—chiral smectic C phase is caused while applying a DC voltage, and a cone edge is made to almost coincide with a rubbing direction. A display mode by the ferroelectric liquid crystal as shown in FIG. 15 is called a "Half—V-shaped switching mode". The vertical axis of the graph shown in FIG. 15 indicates transmittance (in an arbitrary unit) and the horizontal axis indicates applied voltage. The details of the "Half-V-shaped switching mode" are described in "Half—V-shaped switching mode FLCD" by Terada et al., Collection of Preliminary Papers for 46th Applied Physics Concerned Joint Lecture Meeting, March 1993, p. 1316, and "Time-division full-color LCD with ferroelectric liquid crystal" by Yoshihara et al., Liquid Crystal, Vol. 3, No. 3, p. 190.

As shown in FIG. 15, it is understood that when such a ferroelectric mixed liquid crystal is used, low voltage driving and gradation display becomes possible. For the liquid crystal display device of the present invention, it is also possible to use the ferroelectric liquid crystal exhibiting such electro-optical characteristics.

A liquid crystal exhibiting antiferroelectricity in some temperature range is called an antiferroelectric liquid crystal (AFLC). In mixed liquid crystals including the antiferroelectric liquid crystal, there is one called a thresholdless antiferroelectric mixed liquid crystal exhibiting electro-optical response characteristics in which transmittance is continuously changed with respect to an electric field. Some thresholdless antiferroelectric mixed liquid crystal exhibits the so-called V-shaped electro-optical response characteristics, and a liquid crystal in which its driving voltage is about ±2.5 V (cell thickness is about 1 μm to 2 μm) has also been found.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large storage capacitor for a pixel. Thus, it is preferable to use the thresholdless antiferroelectric mixed liquid crystal having small spontaneous polarization.

Since low voltage driving can be realized by using such a thresholdless antiferroelectric mixed liquid crystal for the liquid crystal display device of the present invention, low power consumption can be realized.

As described above, according to the present invention, in fabrication of a pixel matrix circuit of an AM-LCD, a dielectric of a storage capacitor can be made thin without increasing the number of steps, and it is possible to form the storage capacitor having a small area and having large capacity. Thus, even in the AM-LCD having a size of 1 inch or less in diagonal, it becomes possible to secure sufficient storage capacitor without lowering an opening ratio.

What is claimed is:

1. A semiconductor device comprising a pixel thin film transistor and a driver circuit for driving said pixel thin film transistor both formed over a same substrate, said semiconductor device comprising:
   a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1 \times 10^{19}$ atoms/cm$^3$ or more;
   a first insulating film adjacent to said channel formation region;
   a second insulating film adjacent to said capacitor formation portion of said semiconductor layer, wherein said second insulating film is thinner than said first insulating film;
   a gate electrode adjacent to said channel formation region with said first insulating film interposed therebetween;
   an upper capacitor electrode to form a storage capacitor adjacent to said capacitor formation portion of said semiconductor layer with said second insulating film interposed therebetween;
   a third insulating film over said storage capacitor and said gate electrode;
   an electrode on said third insulating film;
   a fourth insulating film over said third insulating film and said electrode;
   a black mask on said fourth insulating film;
   a fifth insulating film over said fourth insulating film and said black mask; and
   a pixel electrode on said fifth insulating film, wherein said pixel electrode is electrically connected to one of said pair of impurity regions.

2. A semiconductor device comprising a pixel thin film transistor and a driver circuit for driving said pixel thin film transistor both formed over a same substrate, said semiconductor device comprising:
   a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1 \times 10^{19}$ atoms/cm$^3$ or more;
   a first insulating film adjacent to said channel formation region;
   a second insulating film adjacent to said capacitor formation portion of said semiconductor layer, wherein said second insulating film is thinner than said first insulating film;
   a gate electrode adjacent to said channel formation region with said first insulating film interposed therebetween;
   an upper capacitor electrode of a same material as said gate electrode to form a storage capacitor adjacent to said capacitor formation portion of said semiconductor layer with said second insulating film interposed therebetween;
   a third insulating film over said storage capacitor and said gate electrode;
   an electrode on said third insulating film;
   a fourth insulating film over said third insulating film and said electrode;
   a black mask on said fourth insulating film;
   a fifth insulating film over said fourth insulating film and said black mask; and
   a pixel electrode on said fifth insulating film, wherein said pixel electrode is electrically connected to one of said pair of impurity regions.

3. A semiconductor device comprising:
   a pixel thin film transistor and a driver circuit for driving said pixel thin film transistor both formed over a same substrate, said pixel thin film transistor comprising:
      a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1 \times 10^{19}$ atoms/cm$^3$ or more; and
      a gate electrode adjacent to said channel formation region with a first insulating film interposed there between,
      a storage capacitor electrically connected to said pixel thin film transistor, said storage capacitor comprising:
         said capacitor formation portion of said semiconductor layer; and
         an upper capacitor electrode adjacent to said capacitor formation portion with a second insulating film interposed therebetween, wherein said second insulating film is a thermal oxidation film of said semiconductor layer having a thickness between 10 and 30 nm, and wherein said second insulating film is thinner than said first insulating film.

4. A semiconductor device comprising a pixel thin film transistor and a driver circuit for driving said pixel thin film transistor both formed over a same substrate, said semiconductor device comprising:

a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1\times10^{19}$ atoms/cm$^3$ or more;

a first insulating film adjacent to said channel formation region;

a second insulating film adjacent to said capacitor formation portion of said semiconductor layer, wherein said second insulating film is a thermal oxidation film of said semiconductor layer, and is thinner than said first insulating film;

a gate electrode adjacent to said channel formation region with said first insulating film interposed therebetween;

an upper capacitor electrode to form a storage capacitor adjacent to said capacitor formation portion of said semiconductor layer with said second insulating film interposed therebetween;

a third insulating film over said storage capacitor and said gate electrode;

an electrode on said third insulating film;

a fourth insulating film over said third insulating film and said electrode;

a black mask on said fourth insulating film;

a fifth insulating film over said fourth insulating film and said black mask; and a pixel electrode on said fifth insulating film, wherein said pixel electrode is electrically connected to one of said pair of impurity regions.

5. A semiconductor device comprising a pixel thin film transistor and a driver circuit for driving said pixel thin film transistor both formed over a same substrate, said semiconductor device comprising:

a semiconductor layer over said substrate, said semiconductor layer having at least a pair of impurity regions, a channel formation region between said pair of impurity regions, and a capacitor formation portion, wherein said capacitor formation portion contains a group 15 element and a catalytic element for promoting a crystallization of said semiconductor layer at a concentration of $1\times10^{19}$ atoms/cm$^3$ or more;

a first insulating film adjacent to said channel formation region;

a second insulating film adjacent to said capacitor formation portion of said semiconductor layer, wherein said second insulating film is thinner than said first insulating film;

a gate electrode adjacent to said channel formation region with said first insulating film interposed therebetween;

an upper capacitor electrode to form a storage capacitor adjacent to said capacitor formation portion of said semiconductor layer with said second insulating film interposed therebetween;

a third insulating film over said storage capacitor and said gate electrode;

an electrode on said third insulating film;

a fourth insulating film over said third insulating film and said electrode;

a black mask on said fourth insulating film;

a fifth insulating film over said fourth insulating film and said black mask; and a pixel electrode on said fifth insulating film, wherein said pixel electrode is electrically connected to one of said pair of impurity regions.

6. A semiconductor device comprising a pixel thin film transistor and a driver circuit for driving said pixel thin film transistor both formed over a same substrate, said semiconductor device comprising:

a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1\times10^{19}$ atoms/cm$^3$ or more;

a first insulating film adjacent to said channel formation region;

a second insulating film adjacent to said capacitor formation portion of said semiconductor layer, wherein said second insulating film is thinner than said first insulating film;

a gate electrode adjacent to said channel formation region with said first insulating film interposed therebetween;

an upper capacitor electrode comprising a semiconductor material to form a storage capacitor adjacent to said capacitor formation portion of said semiconductor layer with said second insulating film interposed therebetween;

a third insulating film over said storage capacitor and said gate electrode;

an electrode on said third insulating film;

a fourth insulating film over said third insulating film and said electrode;

a black mask on said fourth insulating film;

a fifth insulating film over said fourth insulating film and said black mask; and a pixel electrode on said fifth insulating film, wherein said pixel electrode is electrically connected to one of said pair of impurity regions.

7. A semiconductor device according to any one of claims 1–6, wherein said first insulating film and said second insulating film comprise silicon oxide.

8. A semiconductor device according to any one of claims 1–6, wherein said first insulating film has a thickness between 50 and 200 nm.

9. A semiconductor device according to any one of claims 1–6, wherein said gate electrode comprises one selected from the group consisting of doped silicon, tungsten, tantalum, molybdenum, and titanium.

10. A semiconductor device according to any one of claims 1–6, wherein said semiconductor device is a liquid crystal display device.

11. A semiconductor device according to any one of claims 1–6, wherein said semiconductor device is an electroluminescence display device.

12. A semiconductor device according to any one of claims 1–6, wherein said semiconductor device is one selected from the group consisting of a personal computer, video camera, a mobile computer, a goggle-type display, a DVD player, a digital camera, a portable telephone, and a portable electronic book.

13. A semiconductor device according to any one of claims 1–6, wherein said semiconductor device is a front type projector.

14. A semiconductor device according to any one of claims 1–6, wherein said semiconductor device is a rear type projector.

15. A semiconductor device according to any one of claims 1, 2, 4, and 5, wherein said fourth and fifth insulating films comprise one selected from the group consisting of polyamide, acrylic, polyamide, and BCB.

16. A semiconductor device according to any one of claims 1, 2, 4, and 5, wherein said black mask comprises titanium.

17. A semiconductor device according to claim 5 wherein a concentration of said group 15 element is between $5\times10^{18}$ and $1\times10^{20}$ atoms/cm$^3$.

18. A semiconductor device according to claim 6, wherein said fourth and fifth insulating films comprise one selected from the group consisting of polyimide, acrylic, polyamide, and BCB.

19. A semiconductor device according to claim 6, wherein said black mask comprises titanium.

20. A semiconductor device comprising:
a pixel thin film transistor and a driver circuit for driving said pixel thin film transistor both formed over a same substrate, said pixel thin film transistor comprising:
a semiconductor layer over said substrate, said semiconductor layer having at least a pair of impurity regions, a channel formation region between said pair of impurity regions, and a capacitor formation portion, wherein said capacitor formation portion contains a catalytic element for promoting a crystallization of said semiconductor layer at a concentration of $1\times10^{19}$ atoms/cm$^3$ or more; and
a gate electrode adjacent to said channel formation region with a first insulating film interposed there between,
a storage capacitor electrically connected to said pixel thin film transistor, said storage capacitor comprising:
said capacitor formation portion of said semiconductor layer; and
an upper capacitor electrode adjacent to said capacitor formation portion with a second insulating film interposed therebetween, wherein said second insulating film is thinner than said first insulating film.

21. A semiconductor device according to claim 20 wherein said first insulating film and said second insulating film comprise silicon oxide.

22. A semiconductor device according to claim 20 wherein said first insulating film has a thickness between 50 and 200 nm.

23. A semiconductor device according to claim 20 wherein said gate electrode comprises one selected from the group consisting of doped silicon, tungsten, tantalum, molybdenum, and titanium.

24. A semiconductor device according to claim 20 wherein said semiconductor device is a liquid crystal display device.

25. A semiconductor device according to claim 20 wherein said semiconductor device is an electroluminescence display device.

26. A semiconductor device according to claim 20 wherein said semiconductor device is one selected from the group consisting of a personal computer, a video camera, a mobile computer, a goggle-type display, a DVD player, a digital camera, a portable telephone, and a portable electronic book.

27. A semiconductor device according to claim 20 wherein said semiconductor device is a front type projector.

28. A semiconductor device according to claim 20 wherein said semiconductor device is a rear type projector.

29. A semiconductor device according to any one of claims 1–6, and 20 wherein said catalytic element comprises at least one selected from the group consisting of nickel, cobalt, palladium, germanium, platinum, iron, and copper.

30. A semiconductor device according to any one of claims 1–6, and 20 wherein said channel formation region contains said catalytic element at a concentration of $2\times10^{17}$ atoms/cm$^3$ or less.

* * * * *